United States Patent [19]
Reed et al.

[11] Patent Number: 5,771,244
[45] Date of Patent: Jun. 23, 1998

[54] UNIVERSAL REED-SOLOMON CODER/ENCODER

[75] Inventors: Irving S. Reed, Los Angeles; Chin Chi Hsu, Alhambra; T. K. Truong, Pasadena, all of Calif.

[73] Assignee: University of Southern California, Los Angeles, Calif.

[21] Appl. No.: 208,269

[22] Filed: Mar. 9, 1994

[51] Int. Cl.$^6$ .................................................... G06F 11/10
[52] U.S. Cl. ................................. 371/37.01; 371/37.07; 371/37.11; 371/37.12; 371/37.8
[58] Field of Search ................................ 371/37.1, 38.1, 371/39.1, 40.1, 37.01, 37.5, 37.8, 37.9, 37.07, 37.08, 37.09, 37.11, 37.12

[56] References Cited

U.S. PATENT DOCUMENTS

| | | |
|---|---|---|
| 4,413,339 | 11/1983 | Riggle et al. . |
| 4,567,594 | 1/1986 | Deodhar . |
| 4,583,225 | 4/1986 | Yamada et al. . |
| 4,584,686 | 4/1986 | Fritze . |
| 4,646,301 | 2/1987 | Okamoto et al. ........................ 371/37.1 |
| 4,649,541 | 3/1987 | Lahmeyer . |
| 4,675,869 | 6/1987 | Driessen ................................. 371/37.1 |
| 4,683,572 | 7/1987 | Baggen et al. . |
| 4,742,519 | 5/1988 | Abe et al. . |
| 4,852,099 | 7/1989 | Ozaki . |
| 4,873,688 | 10/1989 | Maki et al. . |
| 4,888,778 | 12/1989 | Brechard et al. ....................... 371/37.4 |
| 4,907,233 | 3/1990 | Deutsch et al. . |
| 4,975,867 | 12/1990 | Weng .................................... 364/746.1 |
| 5,115,436 | 5/1992 | McAuley ................................ 371/37.1 |
| 5,130,990 | 7/1992 | Hsu et al. .............................. 371/37.1 |
| 5,170,399 | 12/1992 | Cameron et al. . |
| 5,325,373 | 6/1994 | Iwamura et al. ........................ 371/37.1 |

OTHER PUBLICATIONS

I.S. Hsu et al., "A Comparison of VLSI Architectures for Time and Transform Domain Decoding of Reed–Solomon Codes" DSN Progress Report 42–92, Oct.–Dec. 1987, pp. 63–81.

S. R. Whitaker et al., "Reed Solomon VLSI Codec For Advanced Television", IEEE Transactions on Circuits and Systems for Video Technology, vol. 1, No. 2, Jun. 1991, pp. 230–236.

I.S. Reed, et al. "Further Results on Fast Transforms for Decoding Reed–Solomon Codes Over GF($2^n$) for n=4,5,6, 8"; DSN Progress Report 42–50, Jan. and Feb. 1979; pp. 132–155.

T.K. Truong et al., "Erasures of Reed–Solomon Code Using Euclidean Algorithm", IEE Proceedings, vol. 135, Pt. E, No. 6, Nov. 1988; pp. 318–324.

"Decoding of B.C.H. and R.S. Codes With Errors and Erasures Using Continued Fractions", Electronics Letters, Aug. 16, 1979, vol. 15, No. 17, pp. 542–543.

Reed et al., "The Fast Decoding of Reed–Solomon Codes Using Fermat Theoretic Transforms and Continued Fractions", IEEE Transactions on Information Theory, Jan. 1, 1978, vol. IT-24, No. 1, pp. 100–106.

International Search Report.

*Primary Examiner*—Reba I. Elmore
*Assistant Examiner*—Thomas E. Brown
*Attorney, Agent, or Firm*—Fish & Richardson P.C.

[57] ABSTRACT

A Reed-Solomon encoding and decoding system is described which uses the decoder as an encoder. The input bit is formed into a codeword having all parity symbols marked as erasures. The decoder decodes this codeword by inputting the proper parity information. Various techniques of operating a preferred Reed-Solomon coder over the Galois Field GF(257) are also described. Special calculation load reduction techniques over GF(257) and GF(256) are also described.

12 Claims, 16 Drawing Sheets

UNIVERSAL REED-SOLOMON CODER/ENCODER

FIELD OF THE INVENTION

The present invention relates to a Reed-Solomon device which performs both coding and encoding using a common device. More specifically, the present invention relates to a Reed-Solomon coder/encoder system using the Fermat prime 257 field.

BACKGROUND AND SUMMARY OF THE INVENTION

Every physical channel over which data is transmitted has error. Sometimes the error is negligible, but other times the error is significant. The goal of error correction is to minimize any resultant error.

Error correction systems use multiple approaches. A first stage of error correction is error avoidance, which includes such measures as creating bad block files on hard discs, or rewriting based on a read-after-write error. The data is then prepared for sending over the channel, and the channel produces errors. The occurrence of error is first detected when the data is then received.

One very simple error correction technique is to detect errors which are greater than a certain amount, and to request retransmission of that data. This is not possible in non-interactive applications where the channel is a media such as computer hard disks, CD audio or television transmission.

Error correction uses a code within the data to correct identified errors. If the error cannot be corrected, error concealment attempts to hide the error as much as possible.

Error detection and correction relies on the concept of parity. The basic rule is that each parity bit added to a message can detect one error or the position of one error. Proper use of error correction requires determining the maximum allowable number of errors, and using a number of parities appropriate thereto. For example, if there are eight possible errors in a channel, 16 parities are necessary to identify and correct the errors. A message with added parity bits is called a codeword. The codeword includes parity bits which are essentially redundant of the data itself.

One of the most commonly used error correcting schemes is known as Reed-Solomon Code, and was first described in "Polynomial codes over certain finite fields", Reed I. S and Solomon G, *Journal of Society of Industrial Application Mathematics* 8, 300–304 (1960). The basic concepts of Reed-Solomon coding are now well known to those of ordinary skill in the art. Many attempts have been made by the art to improve the basic Reed-Solomon system.

Many different ways of preparing and using Reed-Solomon encoders and decoders are well known in the art. See for example U.S. Pat. No. 4,907,233 which shows a Reed-Solomon encoder in VLSI and U.S. Pat. No. 5,130,990 which shows a Reed-Solomon decoder in VLSI. The disclosures of both these documents are herewith incorporated by reference. See also U.S. Pat. Nos. 4,162,480 and 4,410,989 which are herewith incorporated by reference.

The established teaching in the art has been to use a first separate and dedicated device to decode and a second separate and dedicated device to encode. Therefore, a channel has typically included a channel encoder and also a separately-provided channel decoder. Many, many man-hours of effort go into producing each device.

The present invention avoids this problem by providing, for the first time, a way to use a decoder, not only to decode, but also to encode. In this way, a single decoder device is used both for encoding and for decoding. In a half-duplex system, the decoder can be used both for decoding and encoding, while a full-duplex system will require two decoders, one configured as a decoder and another configured as an encoder.

Reed-Solomon coders rely on the mathematics of Galois fields, which are disclosed in U.S. Pat. Nos. 4,142,174 and 4,567,594, the disclosures of which is herewith incorporated by reference.

As a brief summary, Reed-Solomon codes are defined with code symbols from a Galois Field of numbers represented as GF(Q), where Q is a positive integer. A Galois Field has a finite number of elements, each of which have the property that any power of any element of the field becomes another element of the field.

The Galois Field manipulation must be carried out by a processing structure. Previously, this has been preferred to be done in a dedicated hardware system. Previous Reed-Solomon Galois Fields have typically been described as being over $G(2^n)$. See for example U.S. Pat. Nos. 4,584,686 and 4,413,339.

The present invention goes against the established teaching in the art in many ways. First, the present invention uses a Galois Field of a number which is not a power of 2, specifically a prime number of 257, but more generally a field $GF(2^n+1)$. The inventors of the present invention have found special advantages from using these specific fields, which are described herein, and found special ways to overcome the problems which previously existed in the prior art when numbers other than $2^n$ were used.

Another aspect of the present invention is that it intends to use a microprocessor with a cache memory which is typically 8,000 to 10,000 bits. The Reed-Solomon calculations are stored into the cache memory, allowing high speed manipulation of the data.

The present invention also teaches many ways of solving many endemic problems in the prior art in new and novel ways.

During sending of codes, it is necessary to identify the beginning and end of codes, so that one can determine when the message ends and parity begins. This requires that synchronization be obtained. The present invention teaches a completely novel way of maintaining synchronization.

Another important aspect of the present invention is the technique of determining erasure locations in order to double the error-correcting capability of a Reed-Solomon decoder.

The present invention contemplates operation with both or either of a time domain decoder and/or a transform domain decoder. Either such decoder can be effected by appropriately configuring and programming a microprocessor-based system, or by a VLSI technique. Of course, it should be understood that while the present invention is preferably directed to a Reed-Solomon decoder, the teachings given herein can also be applied to a Reed-Solomon encoder. For this purpose, the term "Reed-Solomon decoder" as used throughout the specification and claims should be understood to be equally applicable to an encoder.

The present invention has another objective of simplifying the way in which this data is calculated. These tables which are calculated are tables taking advantage of the realities of Galois fields. As discussed above, a Galois field is one where any primitive taken to any power equals another member of the field. Accordingly, we store two look-up tables, one which we call NUM2POWER which takes a primitive to a power and outputs the power. We call the other POWER2NUM, which takes input as a number, and provides an output of the primitive to the power. The inventors of the present invention found specific ways to use these look-up tables such that all necessary calculations can be carried out with only addition and subtraction steps. This facilitates the architecture when a reduced instruction set ("RISC") system is used.

The present invention also uses a specific method of detecting erasures without correcting them. The present invention uses a probability formula to determine whether a symbol includes an error. If the symbol can be determined to include an error without using the Reed-Solomon code to do this, then half as many parities are necessary for a given number of errors.

BRIEF DESCRIPTION OF THE DRAWINGS

These and other aspects of the invention will now be discussed in detail with respect to the accompanying drawings, wherein.

DESCRIPTION OF THE PREFERRED EMBODIMENT

In order to better understand the description given herein, some mathematical preliminaries will be discussed first. The mathematical terminology used in this initial section will be continued throughout this disclosure.

Figure 1:
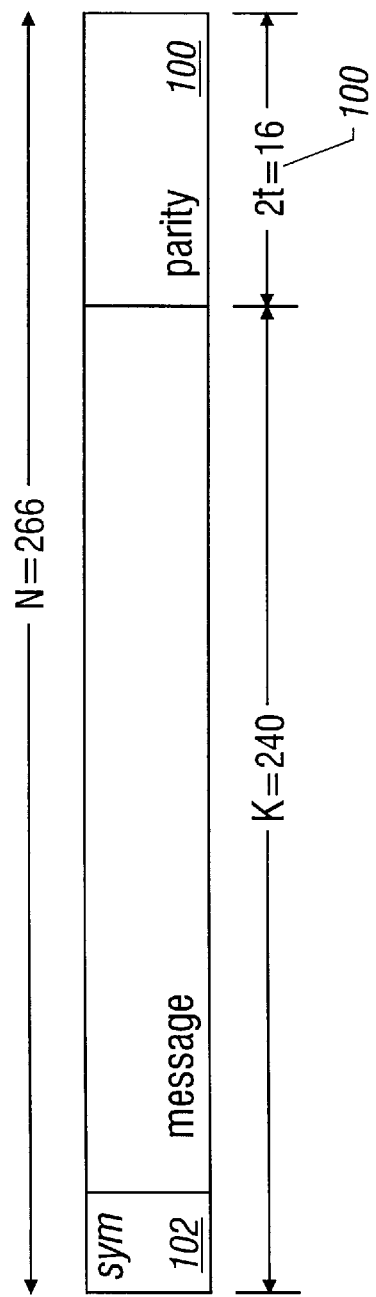
FIG. 1 shows a Reed-Solomon message.

The Reed-Solomon code over a finite field is briefly summarized in the following. The preferred Reed-Solomon encoded packet is shown in FIG. 1. Packet 100 includes a total of N symbols 102, with K message symbols, and 2t=d−1=N−K parity symbols, where t is the maximum allowable number of errors, and d is the minimum distance of the code. In the preferred embodiment of the invention, the total length of the code N is 256 and the symbols are 9-bits in length. This means that the message K is 240 symbols and there are 2t=16 parity symbols. Therefore, the preferred code allows at least t=8 symbol errors can be corrected. Additionally, however, the present invention teaches a way to allow more than t symbol errors to be corrected. Of course, it should be understood that any length message and parity is possible and that these preferred numbers are not limiting. The parity symbols are derived from the K message symbols in the packet.

Each symbol 102 is an element of the Galois field GF(Q) which has a total of Q different elements. In this preferred embodiment, Q=257.

The message in the packet is represented as a polynomial m(x) over the finite field as follows, $$m(x) = \sum_{k=0}^{K-1} m_k x^k, \tag{1}$$

where $m_k$ is an element of the field GF(Q) for k=0,1, . . . (K−1). A generator polynomial g(x) for the Reed-Solomon code is of the form:

$$g(x) = \prod_{k=b}^{b+d-2} \cdot (x - \alpha^k), \tag{2}$$

where d−1=N−K is the number of parity symbols and b is a constant integer to be chosen.

$\alpha$ is the primitive element of the finite field GF(Q), with the Galois property that any non-zero element is some integer power of $\alpha$.

The encoded packet is expressed as $$c(x)=x^{d-1}m(x)+p(x), \tag{3}$$

where $x^{d-1}m(x)$ is the message and p(x) is the parity polynomial. The parity polynomial has a degree less than d−1.

The parities are determined by the negative of the remainder polynomial of $x^{d-1}m(x)$ divided by g(x). Thus, the codeword c(x) is always a multiple of g(x). One of the great advantages of Reed-Solomon coding is that it requires only simple algebra to calculate. The standard implementation of the encoder needs only a division of polynomials over GF(Q) in order to determine the parity symbols. According to the present invention, a technique is disclosed whereby no division at all needs to be carried out and the entire operation is carried out using only addition and subtraction.

The decoder's job is to determine the original codeword c(x) from received corrupted data. Calling r(x) the corrupted word, then $$r(x) = c(x) + e(x) = \sum_{k=0}^{N-1} r_k x^k, \tag{4}$$

$$\text{where } e(x) = \sum_{k=0}^{N-1} e_k x^k \tag{5}$$

is the error polynomial. Each term $e_k x^k$, with a non-zero $e_k$ for k=0,1,2, . . . N−1 represents a symbol error in the encoded packet.

Correcting the message requires correcting errata, which can be either symbol errors or erasures. An erasure is a symbol error with a known location in the corrupted codeword, i.e. the erasure is some $e_v \neq 0$ for a known integer $v \in [0,N-1]$. We define V as the number of erasures (known location) and T as the number of symbol errors with unknown locations. The decoder uses parity information to correct both errors and erasures. For the Reed-Solomon code, the decoder is capable of correcting $d-1=2t=2T+V$ errors and erasures.

Therefore, for a given number of parities, a Reed-Solomon coder can correct twice as many erasures at known locations as it could symbol errors with unknown locations. The present invention exploits this to allow twice as many errors to be corrected, as described herein.

The syndromes of the corrupted codeword r(x) are given by $$S_{b-1+k} = \sum_{i=0}^{N-1} r_i \alpha^{i(b-1+k)} = \sum_{i=o}^{N-1} e_i \alpha^{i(b-1+k)} = \sum_{j=1}^{V+T} Y_j X_j^{b-1+k} \quad (6)$$

for $k=1,2,\ldots d-1$, where $X_j = \alpha^i$ for some integer i is the j-th errata location in the power of $\alpha$ and $Y_j$ is the j-th errata magnitude. Defining the sets, $v = \{X_i | X_i \text{ is an erasure location}\}$ and $\lambda = \{X_i | X_i \text{ is an error location}\}$, the syndrome polynomial becomes $$S(x) = \sum_{k=0}^{d-2} S_{b+k} x^k = \sum_{j=1}^{V+T} \frac{Y_j X_j^b}{1-X_j x} - \sum_{j=1}^{V+T} \frac{Y_j X_j^{b+d-1} x^{d-1}}{1-X_j x} \quad (7)$$

We also define the following polynomials for the decoder:

The erasure locator:

$$v(x) = \Pi_{x_j \in v}(1-X_j X), \quad (8)$$

The error locator:

$$\lambda(x) = \prod_{X_j \in \lambda} (1-X_j x) = 1 + \sum_{j=1}^{T} \lambda_j x^j, \quad (9)$$

The errata locator:

$$\tau(x) = \prod_{j=1}^{V+T} (1-X_j x) = v(x)\lambda(x) = 1 + \sum_{k=1}^{V+T} \tau_k x^k, \quad (10)$$

The extended syndrome polynomial:

$$S(x)v(x), \quad (11)$$

The errata evaluator:

$$A(x) = \sum_{j=1}^{V+T} Y_j X_j^b \Pi_{i \ne j} (1-X_i x) \quad (12)$$

The decoder must solve the following equation called "the key equation" for $\tau(x)$ and $A(x)$:

$$S(x)\tau(x) \equiv S(x)v(x)\lambda(x) \equiv A(x) \bmod x^{d-1} \quad (13)$$

The key equation can be solved by the Euclidean algorithm (see U.S. Pat. No. 5,170,399, whose disclosure is incorporated by reference herein and in "A simplified procedure for correcting both errors and erasures of Reed-Solomon Codes" IEEE Proceedings, Vol. 135, PtE , No. 6 Nov. 1988) to determine $A(x)$ and $\tau(x)$ simultaneously from the following recursive pair of formulae:

$$\gamma_s(x) = -q_{s-1}(x)\gamma_{s-1}(x) + \gamma_{s-2}(x) \quad (14)$$

and $$R_s(x) = -q_{s-1}(x) + R_{s-2}(x) \quad (15)$$

for $s=1,2,\ldots$, where the initial conditions are, respectively, $\gamma_0(x)=v(x), \gamma_{-1}(x)=0$, and $R_0(x)=S(x)v(x), R^{-1}(x)=x^{d-1}$. Here also $q_{s-1}(x)$ is the quotient polynomial of $R_{s-2}(x)$ divided by $R_{s-1}(x)$. The recursive technique stops when the degree of $R_s'(x)$ is less than or equal to $[(d-3+V)/2]$, where $[x]$ denotes the largest integer not exceeding a real number x, for the first time for some integer s' in the recursion process. Then one obtains the solutions, $$A(x) = R_{s'}(x)/\gamma_{s'}(0) \text{ and } \tau(x) = \gamma_{s'}(x)/\gamma_{s'}(0)$$

for (14) and (15), respectively.

A time-domain decoder finds the errata locations by locating the roots of $\tau(x)$ by an exhaustive search over the finite field. After an errata location is obtained, the corresponding errata magnitude is determined by $$Y_k = -A(X_k^{-1})/(X_k^{b-1}\tau'(X_k^{-1})) \quad (16)$$

for $k=1,2,\ldots V+T$.

A transform-domain decoder determines the transformed error pattern sequence $$E_n = \sum_{k=0}^{N-1} e_k \alpha^{nk} \quad (17)$$

for $n=0,1,2,\ldots N-1$ by calculating $$E_n = -\sum_{k=1}^{V+T} \tau_k E_{n-k}, \quad (18)$$

where $\tau_k$, for $k=1,2,\ldots V+T$, are the coefficients of the errata locator $\tau(x)=1+\Sigma_{k=1} \tau_k X^k$. The recursion is started with $E_n = S_n$ for $n=b, b+1, \ldots b+d-2$, and makes use of the property $E_m = E_{m \bmod N}$ for all integers m to obtain the complete transformed error sequence.

After the complete sequence $E_n$ is obtained, an inverse transform is applied to $E_n$ to obtain the error sequence $$e_k = \left( \sum_{n=0}^{N-1} E_n \alpha^{-nk} \right) /N. \quad (19)$$

Then the error sequence $e_k$ is subtracted from the corrupted data sequence to determine the original codeword:

$$r_k = c_k + e_k \quad (20)$$

for $k=0,1,2,\ldots N-1$

A standard Reed-Solomon encoder operates by mathematically calculating the parity values by a polynomial division. Reed-Solomon decoders use a totally different technique. In the prior art, all Reed-Solomon encoders and decoders have been implemented as completely separate systems. The inventors of the present invention have invented a circuit and method whereby a Reed-Solomon decoder can be used both to decode and to encode. To summarize the following, the Reed-Solomon decoder encodes a message polynomial which has been deliberately-corrupted in its parity area. The Reed-Solomon decoder then is "tricked" into re-constituting the deliberately-corrupted area which forms an Reed-Solomon encoded signal. The details of this operation follow.

Figure 2A:
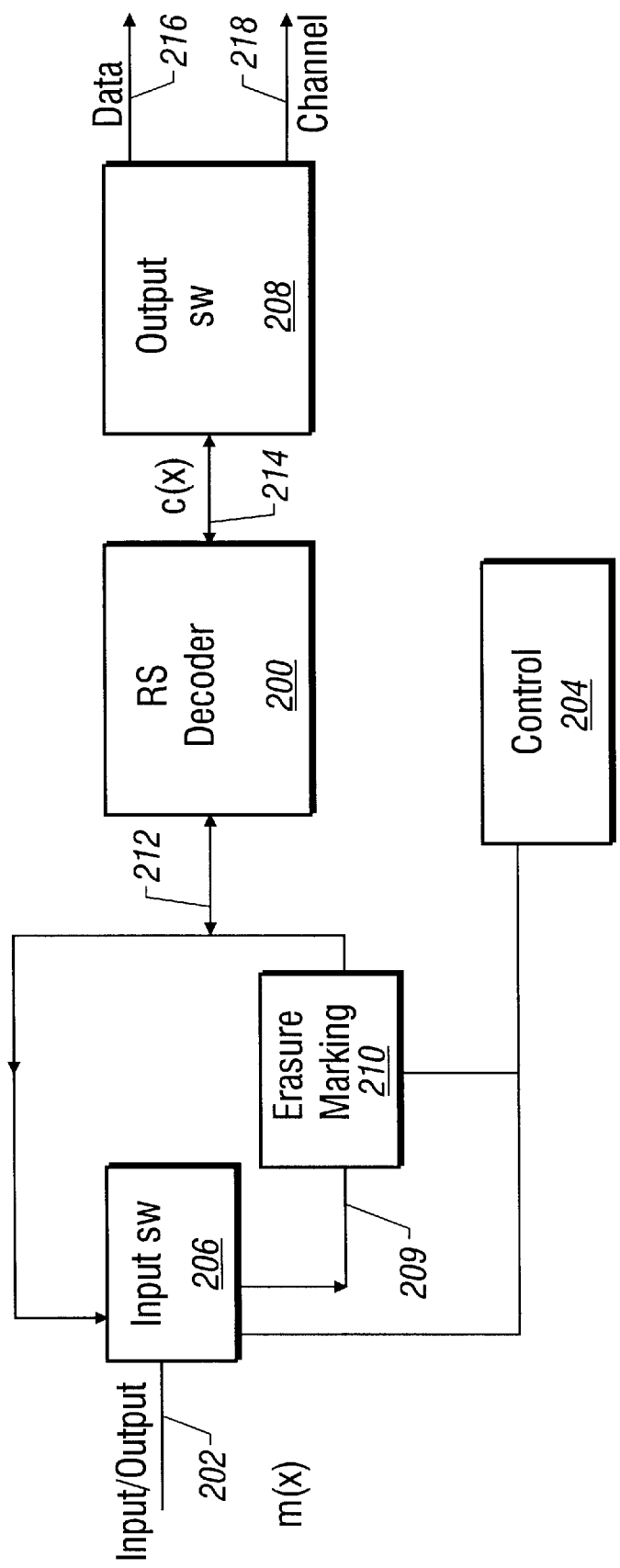
FIG. 2 shows a block diagram of a Reed-Solomon decoding/encoding channel system operating in half duplex mode.
FIG. 2B shows a block diagram of a processor-controlled implementation of a Reed-Solomon decoder.
FIG. 2C shows a hardware implementation of the Reed-Solomon decoder.

FIG. 2 shows the basic block diagram of the universal Reed-Solomon decoder/encoder. FIG. 2 shows the system operating in a half duplex mode, that is, where the same Reed-Solomon decoder 200 is used both for transmission and reception. Obviously, this can only occur when transmission and reception do not occur at the same time. A full duplex system would simply use two identically-constructed Reed-Solomon decoders, one for encoding and the other for decoding. The principles, however, are the same.

The heart of the system is the Reed-Solomon decoder 200. This device can be embodied as a VLSI device such as the one described in U.S. Pat. No. 4,873,688, the disclosure of which is herewith incorporated by reference, or in any of the other patents described herewith or any other way known by the art. The preferred mode of embodying the Reed-Solomon decoder is that described, however, with reference to the following Figures and description. It should be understood, however, that Reed-Solomon decoder 200 is not limited to any of these VLSI systems, and can be, for example, an appropriately-programmed microprocessor or the like.

Data flow starts with the input 202 which is a signal that is either data to be coded or data to be encoded. The condition of the data must be known by the controller 204 which is for example a controlling microprocessor that is controlling the communication operation. Microprocessor 204 controls both the input switch 206 and the output switch 208. These switches may be semiconductor switches or the like. The input and output are switched to the top branch 207 in the case of decoding, when input 202 is to be decoded, and are both switched to the bottom branch 209 when encoding, that is, when the input 202 is to be encoded.

The input circuit top branch 207 is simply a direct connection to the input of the Reed-Solomon coder 200. The input bottom branch 209 is connected to an erasure marking unit 210, whose properties will be discussed herein. Unit 210 can be a dedicated VLSI device which intentionally marks all parity symbols of the codeword as erasures. Alternately, unit 210 can be a processor and/or coprocessor for carrying out these functions.

The signal arriving at input 212 is a codeword to be decoded. The output signal 214 is the coded signal, and output switch 208 is controlled by controller 204 to switch the information to the data line 216, in which case it will be processed as decoded information, or to the channel line 218, in which case it will be transmitted as channel information. This is further described herein with reference to the FIG. 2 block diagram and the flow chart of FIG. 3.

We want to encode a message polynomial m(x) which is input at 202 in step 310. Marking unit 210 marks m(x) with d−1 erasures in the d−1 parity symbols at step 312. The marking operation can be carried out in any conventional way. According to one aspect, or sperate channel is provided to carry separate erasure marking information. The polynomial $m(x)x^{d-1}+P(x)c$ (where P(x)c represents the deliberately-corrupted parity portion) is coupled on line 212 as a codeword to Reed-Solomon decoder 200. All of the d−1 parity symbols of $m(x)x^{d-1}$ are marked as erasures. The decoder decodes $m(x)x^{d-1}$ into a valid codeword $m(x)x^{d-1}+P(x)$ at step 314 with the now-corrected parity polynomial P(x). In this decoding process, the message part $m(x)x^{d-1}$ is left intact.

Hence this process produces the output codeword $c(x)=m(x)x^{d-1}+P(x)$. This is the desired encoded codeword for the message polynomial m(x).

Therefore, the corruption unit 210 has the function of deliberately corrupting the message polynomial m(x) into a codeword m(x)+P(x)c with d−1 erasures which can simply be invalid symbols, or all zeros, in all of the parity symbols thereof.

The above explanation shows that digital communication systems which are equipped with a Reed-Solomon decoder which corrects both errors and erasures in this way, can perform two-way communications without any additional hardware. This technique makes the implementation of an Reed-Solomon decoder which corrects both errors and erasures highly desirable.

The above technique should be considered as the first embodiment, since it is equally applicable for use with any Reed-Solomon decoder system. The following embodiments described herein are the specific preferred Reed-Solomon decoder used according to the present invention. This preferred decoder includes many advantages over the prior art, not least among which are the advantages of the first embodiment.

The preferred Reed-Solomon decoder over $GF(2^n+1)$, more specifically GF(257), as described in detail herein can correct and determine the d−1 parity symbols using less arithmetic operations than the corresponding standard Reed-Solomon encoder/decoder, which uses polynomial division technique whenever d−1 $\geq$ 8. For typical values of d−1 =16 or 32 the preferred Reed-Solomon decoder over GF(257) can produce the encoded codeword with only a small fraction of the arithmetic operations needed by the standard Reed-Solomon encoder.

Figure 2B:
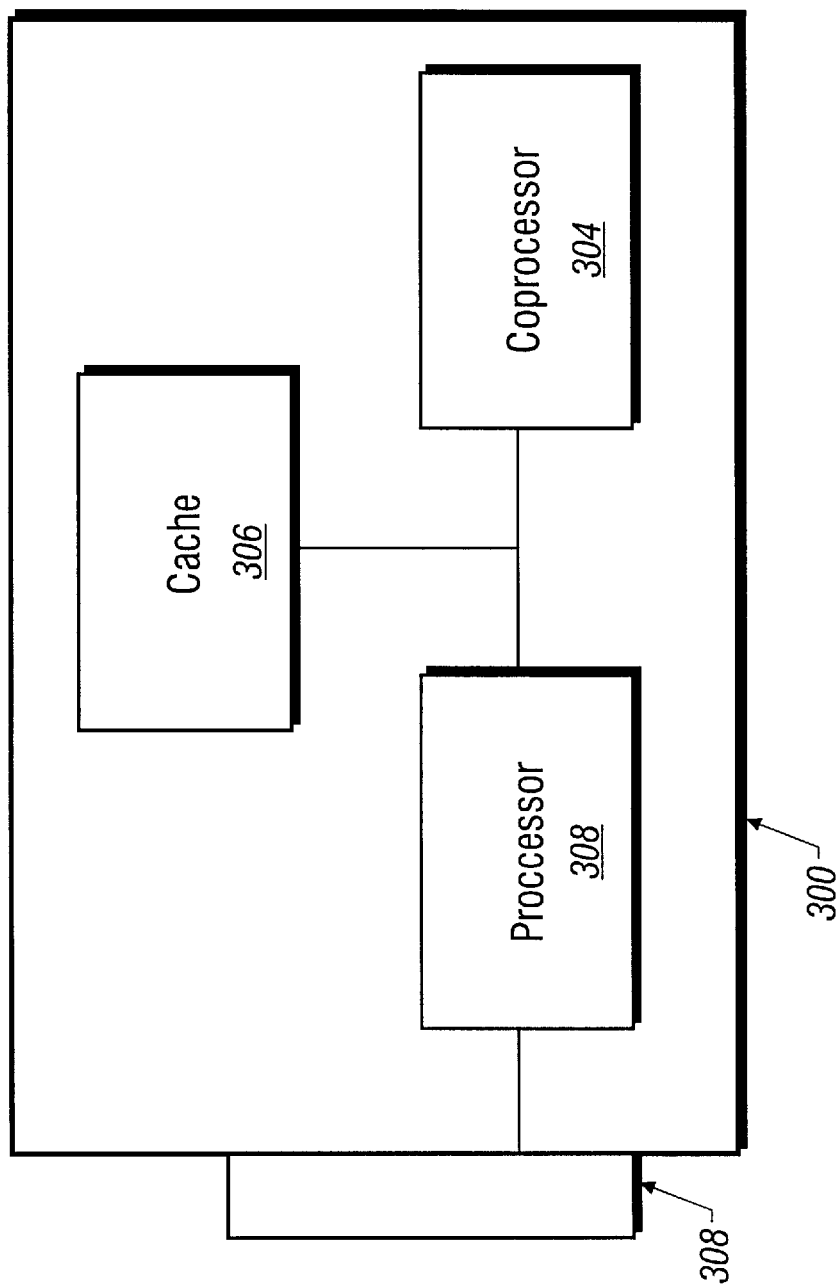
Figure 3:
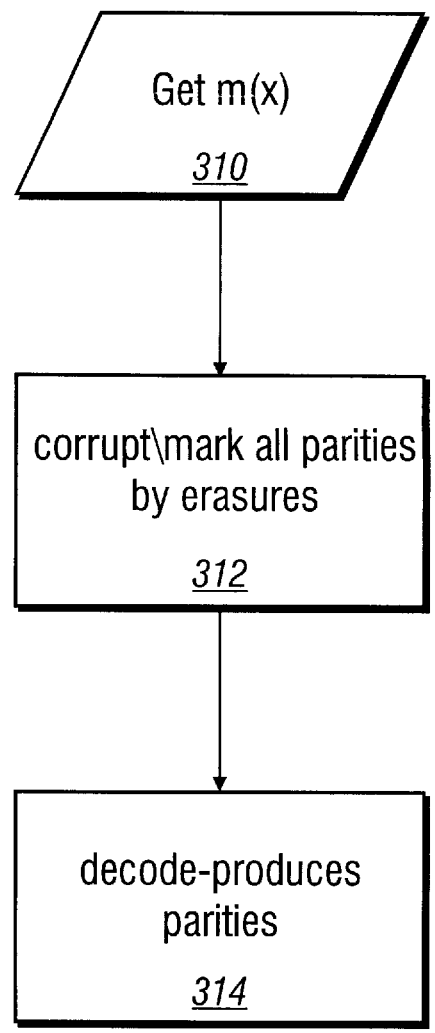
FIG. 3 shows a flowchart of operation of the FIG. 2 embodiment.

The preferred Reed-Solomon decoder according to the present invention carries out its operation over the GF(257). There are two basic overall embodiments of the preferred Reed-Solomon decoder. The second embodiment of this device is a software-driven microprocessor. A block diagram of the second embodiment is shown in FIG. 2b. The flowcharts given throughout this disclosure refer to this second embodiment of the device, and some pseudo-code for programming this device is also provided as a last section.

Figure 2C:
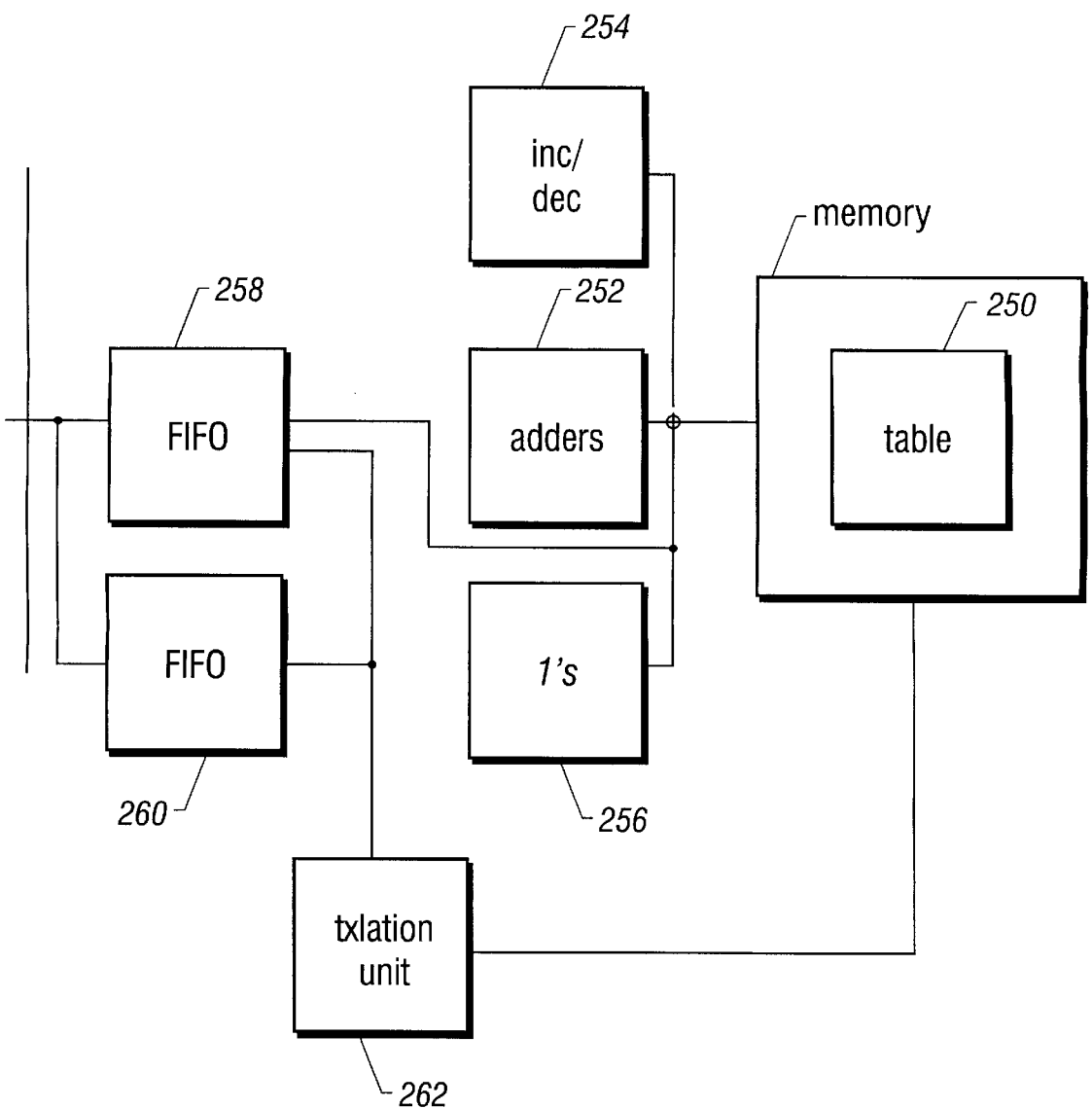

The third embodiment of this device is a hardware-based VLSI system. Those having ordinary skill in the art understand that such a system can be easily built, once the functional flowcharts are given. A block diagram of the third embodiment is shown in FIG. 2c, and is described throughout this description.

The FIG. 2b embodiment shows VLSI chip which includes a processor 302, a coprocessor 304, and a cache memory 306. The data input bus 308 inputs the information to be decoded, which is maintained in cache memory 306.

Both the second and third embodiments encompass operation both as a time domain Reed-Solomon decoder and a transform domain Reed-Solomon decoder. Both the second and third embodiments operate to carry out the summary flowchart of FIG. 4 when operating as a transform domain decoder. The system operates according to the flowchart of FIG. 4b when operating as a time domain decoder. Steps 400, 402, 404, 406 and 408 are common to both time domain and transform domain decoders. More detail about each element of the flowchart is described with reference to further figures.

At step 400, an initial step of detecting erasures is carried out. Erasure detection is effected using both hardware and processing circuitry. The preferred embodiment uses a 9-bit parity symbol, and hence, data can range between 0 and 256. Obviously if a 9-bit parity symbol has a value greater than 256, then the parity is in error and should be marked as an erasure. For each single bit of each symbol, moreover, an allowable voltage range is defined. For example, assuming that TTL levels were used, a value less than 0.2 volts would be obviously wrong and would be marked as an erasure. A value greater than 5 volts, again, would be obviously wrong, and marked as an erasure. In this way, many of the erasures in the codeword can be initially detected. This can be carried out, for example, by a voltage comparator circuit or the like.

At step 402 a synchronization process is carried out. The synchronization process relies on the 9-bit parity having "0" for its leading bit of the first 256 of the 257 elements in the GF(257). Conceptually, it is assumed that each Reed-Solomon codeword consists of d−1, 9-bit parity symbols and K=N−d+1, 8-bit, message symbols for N=256 in GF(257). Also it is assumed that the bits in the message part of a codeword have equal probabilities of being either 0 or 1. Also assume that the receiver has established a bit-stream synchronization with the incoming bit stream, and that all of the bits of a data block are captured and buffered. Then one wants the receiver to be able to determine the starting-bit position of each Reed-Solomon codeword in the data.

There is one chance in 257 that a 9-bit parity symbol happens to be the symbol 256. All of the other 256 elements in GF(257) have "0" for the leading bit of a 9-bit parity symbol. Note by assumption that, except for the leading bit in the parity symbols, the last bits of the parity symbols have approximately equal probabilities of being 1 or 0. That is, the leading bits in the 9-bit parity symbols have quite different statistics from those of all other bits in an Reed-Solomon codeword. We exploit this differing probability function to synchronize the word.

After determining synchronization in step 402, control passes to step 404, in which the syndromes are computed from the data. Special objectives are carried out according to the present invention to streamline the calculation process. If the number of parities is large, the syndromes are calculated by an FFT-like transform or the syndromes can be computed in parallel using a direct method based on Horner's formula. This is discussed in further detail herein.

At step 406 the power expansions of the known erasure locations for $X_j = \alpha^i \in v$ for each known index i are computed, such that the i-th term $r_i$ in the input sequence $r_n$ for n=0,1,2, ... (N−1) to the decoder is marked as an erasure. Then the polynomial expansion of the erasure locator, and the extended syndrome polynomial are computed by the recursive formula:

$$p_n(x) = p_{n-1}(x) \cdot (1 - X_n x) = p_{n-1}(x) - X_n x p_{n-1}(x) \bmod x^{d-1} \quad (21)$$

for n=1,2, ... V where the $X_n$ are the known erasure locations detected at step 400. Here, the initial condition of this recursion is $p_0(x) = S(x)$ for the extended syndrome polynomial and $p_0(x) = 1$ for the erasure-locator polynomial.

At n=V one obtains $p_0(x)$ as the extended syndrome $S(x)v(x)$ for the initial condition $p_0(x) = S(x)$, and also the erasure locator $v(x)$ for the case $p_0(x) = 1$. Another way to compute $S(x)v(x)$ is to compute the circular convolution of the coefficients of the two polynomials $S(x)$ and $v(x)$ by a FFT-like transform.

At step 408, the key equation $$S(x)\tau(x) \equiv S(x)v(x)\lambda(x) \equiv A(x) \bmod x^{d-1} \quad (13)$$

for the errata locator and errata evaluator, is solved for $A(x)$ and $\tau(x)$. The decoder typically uses a polynomial division to solve the key equation. The Euclidean algorithm is preferably used, so that the standard encoder and decoder can be implemented on the same chip.

The transform domain decoder also carries out the steps 410–414 described herein.

At step 410 the errata-locator polynomial and the syndromes are used to obtain the entire transformed error pattern, using the equation $$E_n = -\sum_{k=1}^{V+T} \tau_k E_{n-k}, \quad (18)$$

where $\tau_k$ for k=1,2, ... V+T are the coefficients of the errata locator $$\tau(x) = \prod_{j=1}^{V+T} (1 - X_j x) = v(x)\lambda(x) = 1 + \sum_{k=1}^{V+T} \tau_k x^k, \quad (10)$$

This step may require the most computational load and delay, especially if V+T is large. Since each term of the transformed error sequence depends on other terms, this step could not be accomplished in parallel in previous hardware implementations. However, the present invention describes a computationally simple way of doing this.

Step 412 applies the inverse transform to the transformed error sequence. Some novel ways of carrying out this step are described herein. A division by N is needed at the output of the inverse transform. This division is needed only for the non-zero terms.

Step 414 subtracts the error sequence from the corrupted data. This subtraction is needed only for the non-zero terms in the error sequence. There are at most d−1=N−K non-zero terms. This step can be combined with the non-zero detections in the division by N operation in the inverse transform.

The operation of the time domain decoder is similar to that described above with respect to FIG. 4, but replaces steps 410, 412 and 414 by steps 430 and 432. FIG. 4b shows the flowchart of operation of the transform decoder. Steps 400–408 are the same as that for the time domain decoder.

Step 430 locates the V+T roots of $\tau(x)$ over the finite field GF(257) for the errata locations $X_k$ such that $$\tau(X_k^{-1}) = \lambda(X_j) \cdot v(X_j) = 0 \text{ for } k = 1,2, \ldots V + T. \quad (22)$$

At step 432, the errata magnitudes $Y_k$ are computed as $$Y_k = -A(X_k^{-1})/(X_k^{b-1}\tau'(X_k^{-1})) \text{ for } k = 1,2, \ldots V + T. \quad (16)$$

The polynomial root search is performed as described in more detail herein, preferably by one of the following four methods: a Chien search, the ancient Horner's formula, an FFT-like forward transform, and a proposed difference-table approach. Horner's formula and a Chien search require essentially equal numbers of multiplications and additions, but Horner's formula has the advantage that the search can be performed in parallel for all of the non-zero elements in the field. That is, the test of a possible root location is independent of the tests of other values. Modified techniques for the Chien search and Horner's formula are developed to reduce the number of multiplications and additions over GF(257) by one-half of that needed by the obvious methods. An FFT-like forward transform can be used also. A new approach based on the difference table of a polynomial is described which needs substantially fewer multiplications than all of the above methods.

In summary of the above, the operations involved in the Reed-Solomon encoder and decoder in GF(257) include the following:

1. Basic arithmetic in the finite field,
2. Polynomial divisions for a standard encoder and the Euclidean algorithm,
3. Forward and inverse transforms in the finite field,
4. Polynomial expansions of the product of the syndrome and erasure polynomials,
5. Polynomial evaluations by Horner's formula.
6. Polynomial root searches.

Various techniques and methods for implementing these operations in both software and hardware will now be discussed in more detail.

Figure 4A:
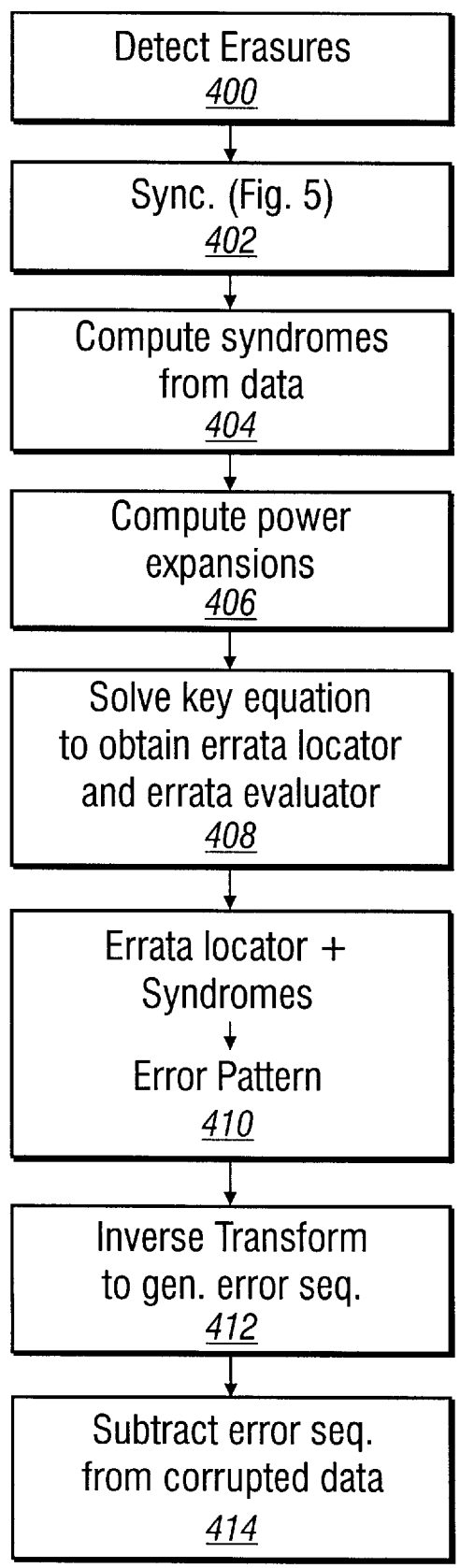
FIG. 4 shows a flowchart of operation of a transform domain decoder.
FIG. 4B shows a flowchart of operation of a time domain decoder.
Figure 4B:
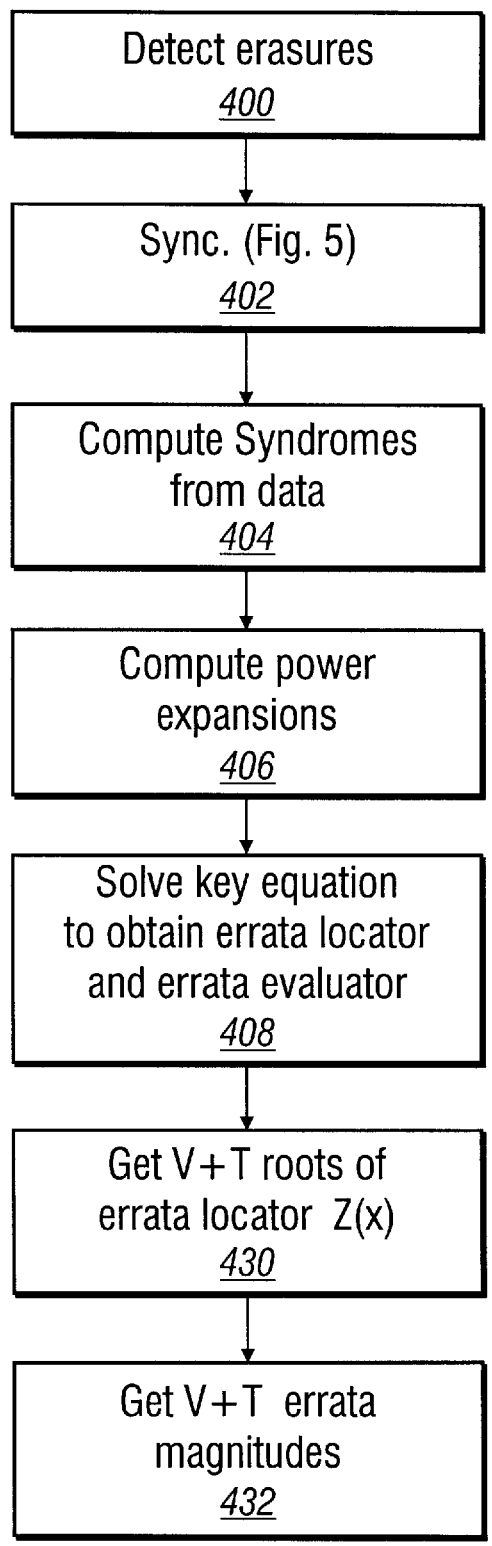

The following constitutes a more detailed description of the FIG. 4 and FIG. 4b flowcharts. We start out by describing a preferred look-up table technique used according to the present invention to improve the throughput thereof.

In a finite field GF(Q) for some prime Q, assume elements a and b are integers in [0,Q−1]. Also assume that a binary operation between a and b or a unary operation of b produces an integer c in [0,Q−1]. The powers of the primitive element α ∈ GF(Q) generate the Q −1 non-zero elements in GF(Q).

One objective of the present invention is to simplify the form of the calculations used to carry out the Reed-Solomon decoding and to use this simplified form with a RISC-type processor. In order to do this, we form, in advance, two look-up tables: NUM2POWER and POWER2NUM:

$$\text{NUM2POWER}[\alpha^n] = n \text{ for } n=0,1,2,\ldots Q-2,$$

$$\text{POWER2NUM}[k] = \alpha^k \text{ for } k=0,1,2,\ldots Q-2,$$

are used for multiplications and divisions in GF(Q). In GF(Q =257) assume a, b and c are stored as 9-bit binary numbers. The 9th bit, i.e. the leading bit, signifies the most significant bit in the binary representation of the number. The basic arithmetic set for GF(257) is defined according to the present invention as follows:

1. Addition, c≡a+b mod Q:

$$c = \begin{cases} a+b-Q & \text{if } (a+b) > Q-1, \\ a+b & \text{otherwise} \end{cases}$$

In GF(257) if a+b>256, we subtract one from the last 8 bits of a+b and set the leading bit to zero. The additions can be performed by 8-bit adders. The 9-th bit of the result a+b is determined by the 9-th bits of a and b and the carry bit of the 8-bit addition.

If the result from the adder is greater than 257, then the digit 1 is subtracted from the last 8 bits of the output of the adder, and the 9-th bit is set to zero. If a=256 and b=256, the output of the 8-bit adder is decremented by one as well. In all other cases the result of a+b is obtained as a 9-bit binary number.

2. Subtraction, c≡a−b mod Q:

$$c = \begin{cases} a-b+Q & \text{if } a < b, \\ a-b & \text{otherwise} \end{cases}$$

The negative of b is 257−b=255−b+2 in GF(257). If b≠0 this can be easily performed by taking the 1's compliment of b's last eight bits, with the leading bit unaltered, then adding 2 to the 9-bit result. The addition of 2=1+1 can be performed by two increments.

For example for b=3, 255−b=252 is the 8-bit 1's compliment of b and 252+2=254 ≡−3 mod 257. If b=256, then taking the 1's compliment of b's last eight bit yields 256+255=511. Add 2 to 511, then the result is 513=1+512. The term $512=2^{10}$ is the 10-th bit which should be discarded. Thus one obtains the result 1≡−256 mod 257.

3. Multiplication, c≡a×b mod Q:

$$c = \begin{bmatrix} 0 & \text{if } a = 0 \text{ or } b = 0, \\ \text{POWER2NUM}[(\text{NUM2POWER}[a] + \text{NUM2POWER}[b]) \bmod (Q-1)] & \text{if } a \neq 0 \text{ and } b \neq 0. \end{bmatrix}$$

In GF(257), Q−1=256, so the multiplication becomes 8-bit additions of NUM2POWER[a] and NUM2POWER[b] for nonzero a and b. The carry, i.e. the 9th bit of the result of the 8-bit addition, is discarded.

Division c≡a/b mod Q and b ≠0:

$$c = \begin{bmatrix} 0 & \text{if } a = 0, \\ \text{POWER2NUM}[(\text{NUM2POWER}[a] - \text{NUM2POWER}[b]) \bmod (Q-1)] & \text{otherwise} \end{bmatrix}$$

one can just take the 8-bit 2's compliment of NUM2POWER[b], and then add NUM2POWER[a] to the result by an 8-bit addition. The inverse of a non-zero element b is $b^{-1}$=POWER2NUM[256−NUM2POWER[b]] for b≠1 and $b^{-1}$=for b=1.

Therefore, the presently-described table look-up approach allows implementation of the basic arithmetic in GF(257) by 8-bit additions, increments, decrements, and 1's compliments without any multiplications or divisions. A hardware implementation of this embodiment allows all elements in GF(257) to be stored as 9-bit binaries and all arithmetic can be performed by 8-bit adders 252 with carries, 8-bit increments, decrementers 254, 1's compliments 256 and comparison circuits.

The two tables NUM2POWER and POWER2NUM are shown in FIG. 2c as table 250. The two collectively have a total of 512 entries. Since $\alpha^{128}$ =−1=256 in GF(257), we can reduce the table sizes by one-half; POWER2NUM[k+128] =257−POWER2NUM[k] for k=0,1,2, . . . 127 and NUM2POWER[n]=128+NUM2POWER[257−n] mod 256 for n=129, . . . 256. The addresses and contents of POWER2NUM[k] for k=0,1,2, . . . 127 and NUM2POWER [n] for n=1,2, . . . 128 are at most 8 bits.

In the VLSI implementation of the present embodiment, this reduction in the table size will save chip area.

The drawback of this table look-up approach is that if RISC-type look ups as described above are carried out for multiplications in parallel, separate buses must be provided for the units in the chip or each unit would need its own tables. This is almost impossible if many multiplications are to be performed in parallel. The remedy to this is to provide several first-in-first-out (FIFO) queues 258,260 for the two look-up tables in the chip. A high-speed translation unit 262 accesses the look-up tables to perform the translation needed for each FIFO. The translation units should operate at the highest speed of the chip. This allows the multiplications to be carried out most efficiently. Since no real multipliers are needed on the chip, a higher operation speed can be achieved.

In the firmware implementation of this embodiment, the table look-up approach can be readily performed. One multiplication is equivalent to two comparisons, one 8-bit addition and three table translations. Most CPUs will effect this much faster than a direct multiplication followed by a modulo 257 operation. This also has special application in a reduced instruction set ("RISC") type microprocessor, since less instructions are necessary.

The steps of FIGS. 4 and 4b will now be described in further detail.

The first step of the process of FIG. 4 is detecting erasures at step 400. Erasure detection enables improved error correction, and special techniques of erasure detection are described herein.

In a digital storage system which uses the Reed-Solomon code for error correction, e.g. in magnetic disks or tapes, optical laser discs and the like, the system can use an error detection circuit to detect error locations in the stored media. The error locations detected are marked as erasures and fed to the Reed-Solomon decoder along with the corrupted codeword for both erasure and error correction.

Figure 6:
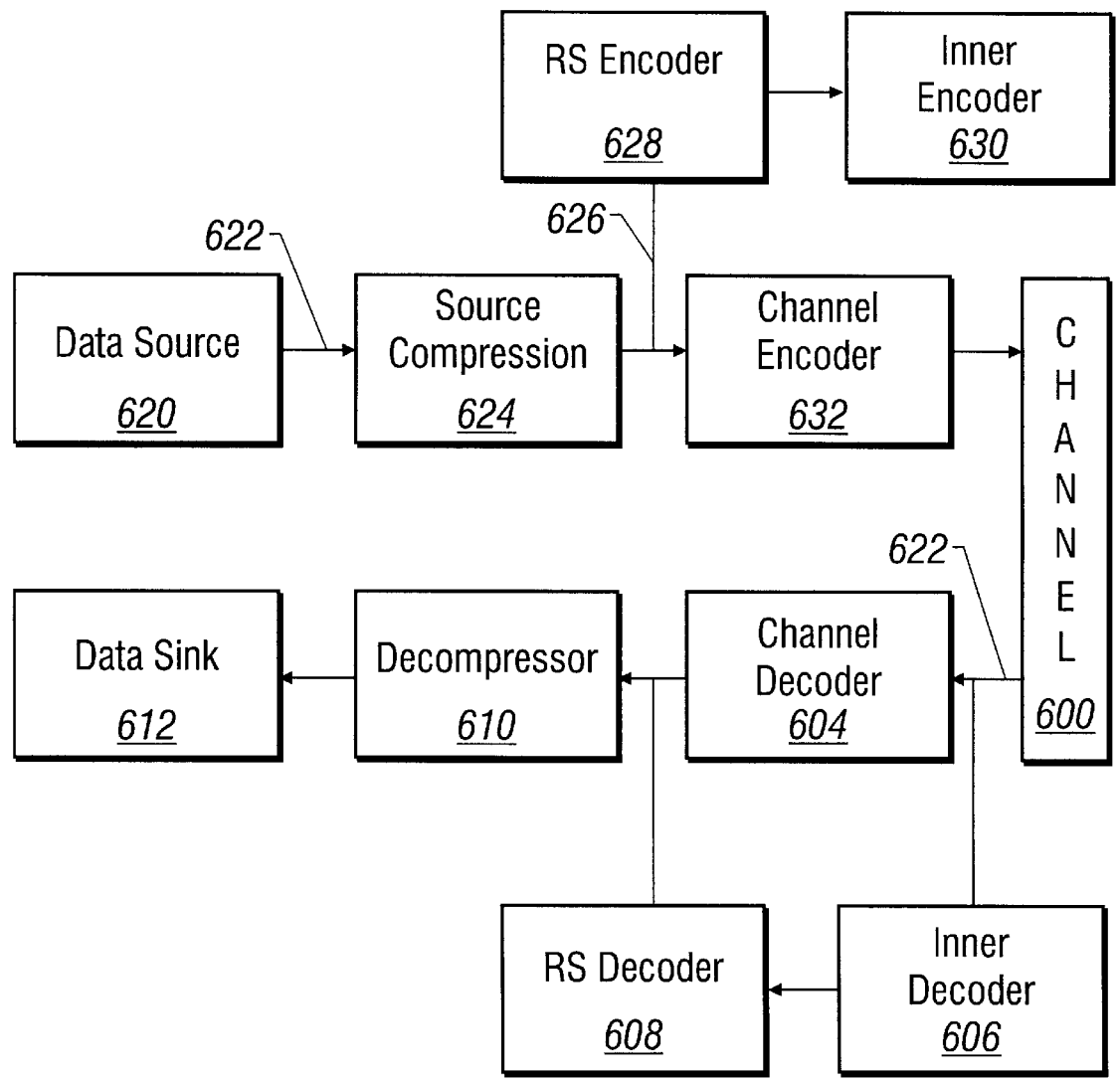
FIG. 6 shows a digital communication system for Reed-Solomon coding.

A digital communication system is shown in FIG. 6. A bit-stream 602 from channel 600 is demodulated and possibly decoded by a channel decoder 604. Decoder 604 includes an inner decoder 606 when a concatenated inner code is used with an outer Reed-Solomon code. If the demodulator or the inner decoder 606 detects any suspicious bits in the Reed-Solomon coded symbols, such information is used to determine the erasure locations needed for the Reed-Solomon decoder 608.

The output of the Reed-Solomon decoder 608 is passed to decompressor 610 which decompresses the information to the data sink 612 which is the user of the information.

The encoding portion operates in an exactly analogous way, with the source of the information, data source 620, providing information 622 to source compressor 624, which compresses that information. The compressed information 626 is provided to a Reed-Solomon encoder 628, to an inner encoder 630, and finally to the channel 600. Reed-Solomon encoder and inner encoder 630 are collectively shown as the channel encoder 632.

Figure 7:
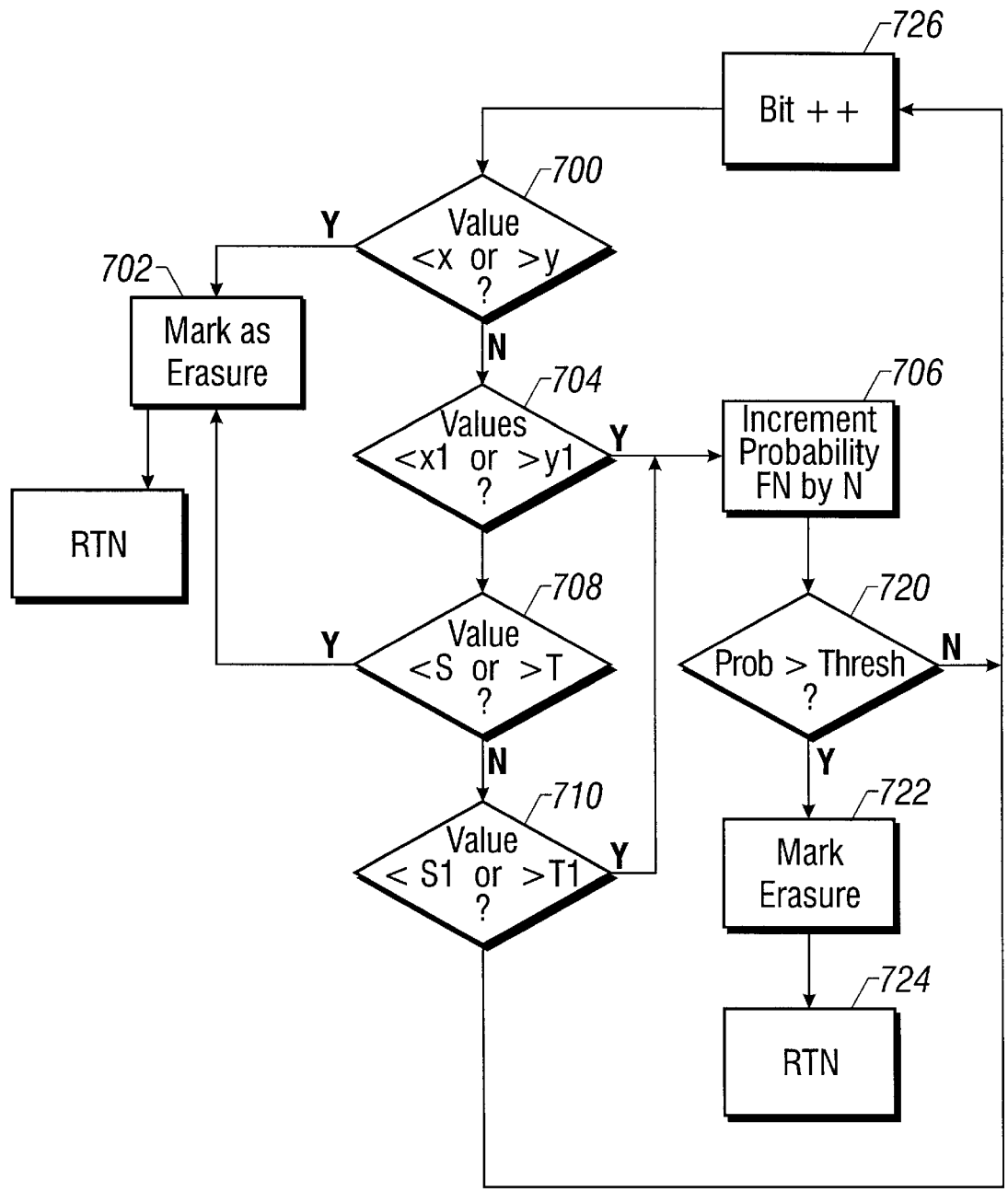
FIG. 7 shows a probability function used according to the present invention to detect probable erasure locations.

The system of the present invention uses a probability function described herein with reference to FIG. 7 to determine if a symbol is correct. For explanatory purposes, we will define that each bit has a value between x, which is the lowest minimum allowable "0" value, and y, which is the highest allowable "1" value. The system tests against x and y at step 700. If the value is less than x or greater than y, then the whole symbol is marked as an erasure at step 702. However, x and y are the absolute maximum cases. We define the value x1 as being the value above which a "0" should normally lie, and the value y1 being the value below which a "1" should normally lie. Therefore, values lower than x1 or higher y1 are considered suspicious. Step 704 tests the values against x1 or y1, and if the value is less than x1 or greater than y1, then the value is suspicious. A positive value at step 704 therefore causes this probability function to be incremented by a value n at step 706 each time a suspicious bit is obtained. If, for example, there are two or more suspicious bits in a symbol, the probability that the symbol is correct is low and should be marked as an erasure for the Reed-Solomon decoder.

The other test situation is for the values s and t. The value s is the maximum value for a "0". The value t is the minimum value for a "1". Therefore, any value that is between s and t is neither a "1" nor a "0". Accordingly, any such value is marked as an erasure at step 702. The test is made at step 708. At step 710, the system is compared with values s1 and t1, which are suspicious values. Again, the probability is incremented for any suspicious value.

According to this embodiment, we define that three suspicious values will increase the probability sufficiently to make it higher than the threshold at step 720, at which point the symbol will be marked as an erasure at step 722 followed by a return to the calling program at step 724. If the probability is not greater than the threshold at step 720, or if the values are measured as acceptable, then the bits are incremented at step 726, followed by control passing to step 700.

In TTL levels, for example, a "0" might be defined as 0–0.8 volts, and a 1 is defined as 3.7–5 volts. If a voltage is 1.5 volts, it falls into the midpoint where we cannot tell with certainty whether the value is 1 or 0. For example, if three suspicious bits are detected in a symbol and each bit is guessed to be 0 or 1 with an error probability of ½, then the probability that the symbol is correct is ⅛ and it can be marked as an erasure.

Assume that the Reed-Solomon decoder can correct T errors and V erasures up to d−1=V+2T=32, that the corrupted codeword has V=24 erasures, and that each marked erasure symbol has a probability of ⅛ or less of being correct. Then the Reed-Solomon decoder can correct on the average 21 erasures and 4 errors with unknown locations. Therefore, this Reed-Solomon decoder has a better error correction performance than a 16-error-correction Reed-Solomon decoder without the erasure correction capability.

The detection of suspicious bits can also be effected using a matched filter in the demodulator or using a Viterbi decoder for an inner convolutional code. One simple inner code for erasure detection is a parity check bit. For GF(257) such a parity bit is appended to each message symbol of the Reed-Solomon code.

In the present modification, the V erasure locations are known. Therefore, only the T unknown error locations need be searched. The inventors therefore, have invented a modification of the original Euclidean algorithm. Instead of solving the errata locator, we solve the error locator $\lambda(x)$ by changing the initial condition, $\gamma_s(x)$ in equation (14), in the Euclidean algorithm to $\gamma_0(x)=1$ and $\gamma_{-1}(x)=0$. By the same recursive formulae (14) and (15), we can obtain the errata evaluator $A(x)=R_s'(x)/\gamma_s'(0)$ and the error locator $\lambda(x)=\gamma-s'(x)/\gamma_s'(0)$ when the technique stops for the first time on the condition $\deg(R_s'(x)) \leq [(d+V-3)/2]$ for some integer s'. The roots of $\lambda(x)$ are searched for unknown error locations. Except for the root search by an FFT-like forward transform, all other methods benefit by the lower degree of the root-search polynomial $\lambda(x)$. To obtain the errata magnitudes by this new technique, one uses the identity:

$$A(X_k^{-1}) = Y_k X_k^b \prod_{j \neq k} (1 - X_j/X_k) \quad (23)$$

$$= Y_k X_k^{b-(V+T-1)} \left( \prod_{j \neq k} (X_k - X_j) \right) \quad (24)$$

To obtain $$Y_k = A(X_k^{-1}) / \left( X_k^{b-(V+T-1)} \left( \prod_{j \neq k} (X_k - X_j) \right) \right) \quad (25)$$

for $k = 1, 2, \ldots V + T$.

$$X_k^{b-(V+T-1)} \left( \prod_{j \neq k} (X_k - X_j) \right),$$

The computation of part of equation 24, can be performed as efficiently as the polynomial evaluation of $$X_k^{b-1} \tau'(x)$$

in the original Euclidean algorithm. However, this new technique does not require the computation of the polynomial expansion of the erasure locator $v(x) = \Pi x_{j \in v}(1-X_j)$. Also fewer arithmetic operations are needed in the polynomial multiplications in equation (14), since now the degree of the new $\gamma_s(x)$ is exactly V less than that of the old $_s(x)$ of the original technique. Actually the old and new $\gamma_s(x)$ in (14) differ by a polynomial factor, the erasure locator $v_x$ of degree V.

Step 402 shows the synchronization process. This relies on statistics: the 9-bit parity having "0" for its leading bit of the first 256 of the 257 elements in the GF(257).

There is one chance in 257 that a 9-bit parity symbol happens to be the symbol 256. All of the other 256 elements in GF(257) have "0" for the leading bit of a 9-bit parity symbol. Note by assumption that, except for the leading bit in the parity symbols, the last bits of the parity symbols have approximately equal probabilities of being 1 or 0. That is, the leading bits in the 9-bit parity symbols have quite different statistics from those of all other bits in an Reed-Solomon codeword. We exploit this differing probability function to synchronize the word.

Figure 5:
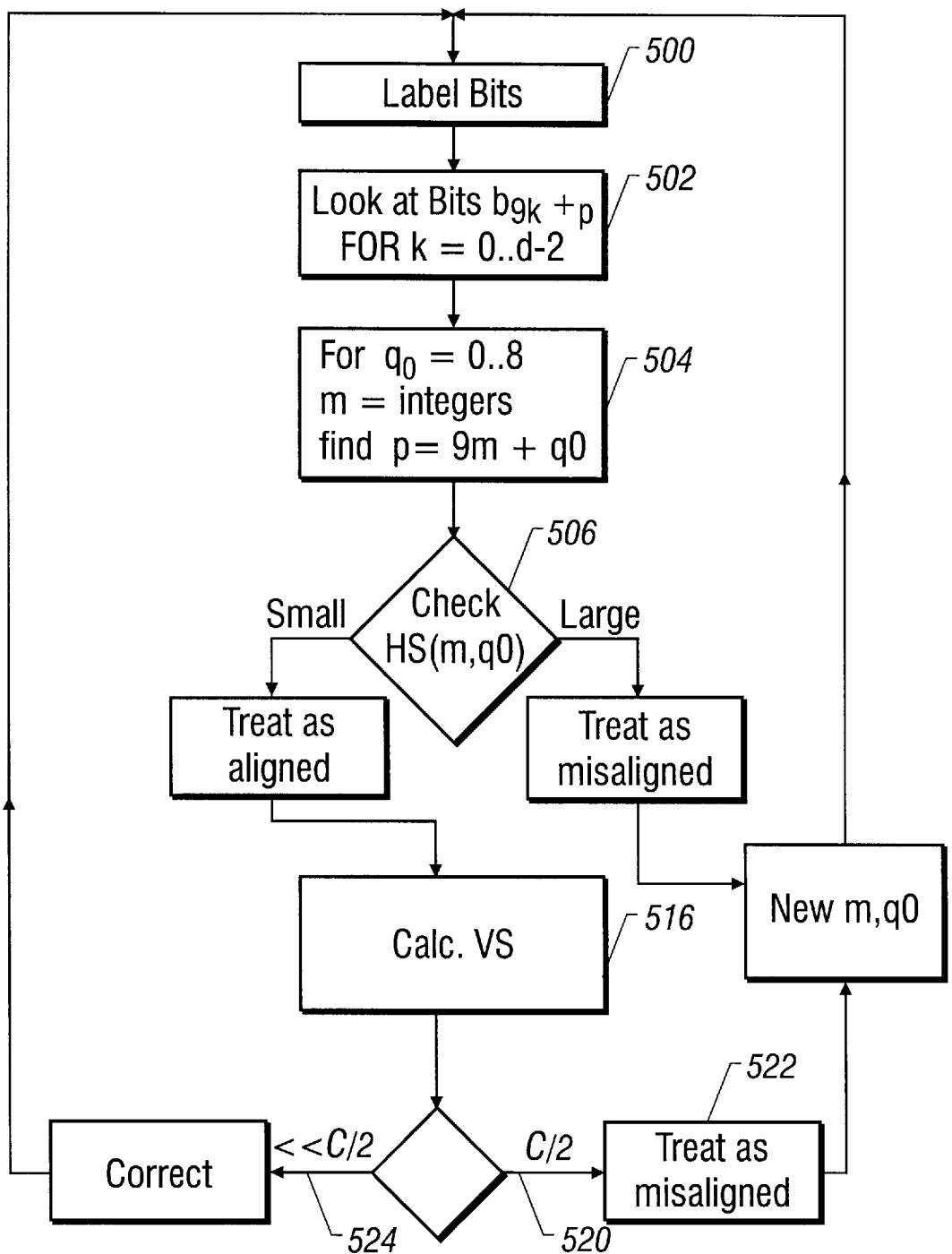
FIG. 5 shows a flowchart of operation of a synchronization system used according to the present invention.

For the typical values of d−1 between 16 and 32, the receiver uses the different statistics of the leading bits in the 9-bit parity symbols in an Reed-Solomon codeword to determine the positions of the 9-th bits of the parity symbols. In a binary data window of bit length=

$$[9(d-1)+8K+9(d-1)=18(d-1)+8K],$$

the bit stream will virtually always have at least one area which contains d−1 consecutive 9-bit parity symbols. The process operates according to the flowchart of FIG. 5. First, at step 500, each bit in the bit stream is labeled by $b_n$ for n=0,1,2, . . . , 18(d−1)+8K−1. Then the consecutive 9-bit parity symbols start from some position $b_p$, and bits of positions $b_{9K+p}$ for k=0,1,2, . . . d−2 are the leading bits of the d−1 consecutive 9-bit parity symbols. The bits are investigated at step 502, where most of the bits, $b_{9k+p}$ for k=0,1,2, . . . d−2, are zero. The receiver locates the bit position p by determining p=9m+$q_0$ for integers m and 0≦$q_0$<9 at step 504. There are nine possible values of $q_0$. For each possible value of $q_0$ the receiver checks the sum $$HS(m,q_0) = \sum_{k=0}^{d-2} b_{9k+9m+q_0}$$

according to the flowchart of FIG. 5, first for m=0,1,2, . . . d+[8K/9] at step 504. If the bit $b_{9m+q_0}$ and the bit $b_9$(d−2)=9m+q0fall in the message part then the values HS(m,$q_0$) is around [d−½] for all nine possible values of $q_0$. When the bit $b_{9m+q_0}$ falls near the beginning of a consecutive 9-bit parity area and $q_0$ coincides with the 9-th bit boundary of the parity area, the value of HS(m,$q_0$) is substantially smaller than those values of HS(m,$q_0$) for mis-aligned m and $q_0$. Thus the values of HS(m,$q_0$) monitored by stop 506 allow determination of the 9th bit boundary $q_0$ in the parity area and several possible locations of the starting position 9m+$q_0$ in an Reed-Solomon codeword.

To determine the exact starting position of the parity region, the receiver calculates the sum $$VS(m,q_0) = \sum_{k=0}^{C-1} b_{9m+q_0+kL}$$

at step 516 where L=9(d−1)+8K is the bit length of an Reed-Solomon codeword and the bit stream $b_n$ for n=0,1,2, . . . CL−1 contain at least C−1 Reed-Solomon codewords. If the guessed possible position 9m+$q_0$ is in the message area then the value of VS(m,$q_0$) is about [C/2] as shown in branch 520. The message is treated as mis-aligned at step 502. When the starting position in the parity area coincides with the correct m and $q_0$, the values of VS(m+9k,$q_0$) for k=0,1,2, . . . d−2 are substantially smaller, as shown in branch 524 and easily distinguished from the wrong values of m and $q_0$.

Figure 5B:
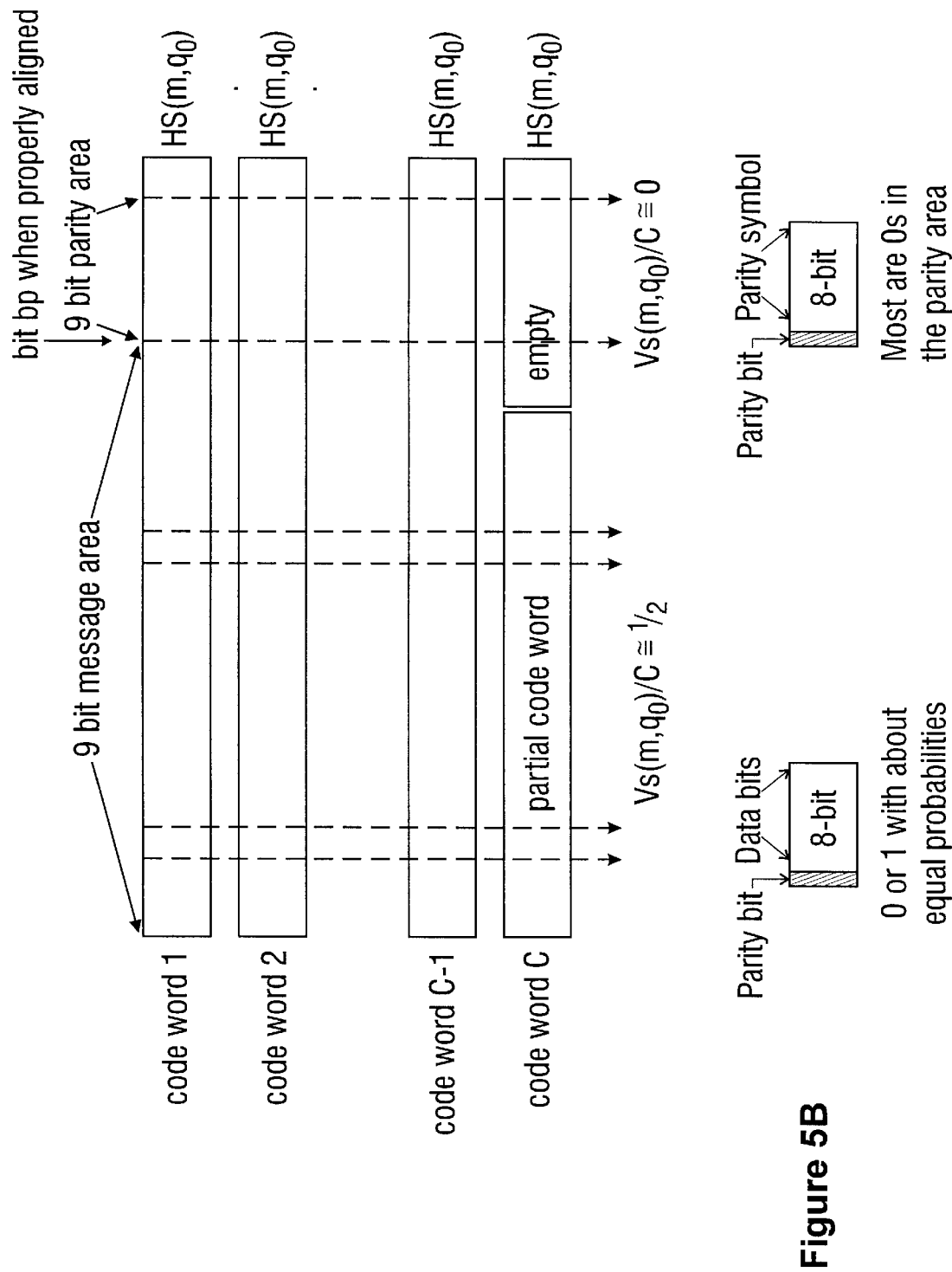
FIG. 5B shows the proper synchronization of bit patterns according to the present invention.

For the typical value of d−1=32 and C=32, the above scheme is very robust for the problem of the Reed-Solomon codeword synchronization even in a noisy channel. The bits in the corrupted message parts and the corrupted last 8 bits of the parity symbols would still have about equal probabilities of being either 1 or 0. The corrupted leading bits in the 9-bit parity symbols still have different statistics from other bits in the bit stream of the Reed-Solomon codewords. The geometry of a properly aligned bit stream of the Reed-Solomon codewords over GF(257) is illustrated in FIG. 5B.

After determining synchronization in step 402, control passes to step 404, in which the syndromes are computed from the data.

To compute the syndromes of the received codeword, recall from equation (15) that the corrupted word $$r(x) = \sum_{k=0}^{N-1} r_k x^k, \quad (15)$$

where x=$\alpha^m$ for m=b,b+1, . . . b+d−2. We describe here multiple embodiments of syndrome computation.

The first embodiment of syndrome computation is by using Horner's formula.

To evaluate a polynomial τ(x) of degree N−1 efficiently, we can express the polynomial by Horner's formula as $$r(x)=( \ldots ((r_{N-1}x+r_{N-2})x+R_{N-3}) \ldots )x+r_0 \quad (26)$$

Only one multiplication and one addition are needed within each nested parenthesis. For a particular value of x, N−1 multiplications and N−1 additions are required. For the syndrome computation this method needs (d−1)(N−1) multiplications and (d−1)(N−1) additions.

This technique is referred to as Horner's formula for polynomial evaluations. The primary advantage of Horner's formula over other methods in a hardware implementation is that the computation of each syndrome can be performed in parallel.

The inventors of the present invention have also discovered a special forward transform which can be used to calculate the syndromes over the finite field.

For an N-point sequence $f_n$ ∈GF(Q) for n=0,1,2, . . . N−1 the forward transform is defined by $$F_k = \sum_{n=0}^{N-1} f_n \omega^{nk} \quad (27)$$

for k=0,1,2, . . . N−1. The inverse transform is $$f_n = \frac{1}{N} \sum_{k=0}^{N-1} F_k \omega^{-nk} \quad (28)$$

for n=0,1,2, . . . N−1 and $\omega^N$=1 in GF(Q).

Since N=256 in GF(257), the inventors of the present invention found a new way to use the forward and backward transforms, referred to herein as FFT-like: The FFT-like technique requires only 8×128=1024 multiplications and 8×256=2048 additions.

The decoder can use the FFT-like technique to compute the syndromes if ω is equal to the same primitive element α over GF(257) used in the Reed-Solomon encoder. In a firmware implementation this is much faster than a direct evaluation by Horner's formula.

The number of additions and multiplications needed in the syndrome computations by the FFT-like forward transform can be reduced further. The inventors of the present invention realized that one does not need to compute all of the 256 transform coefficients, but only the (d−1) coefficients of the desired syndromes.

Assume that the input data sequence is $r_n$ for n=0,1,2 , . . . 255. Then, using equation (6)

$$S_{b-1+k} = \sum_{i=0}^{N-1} r_i \alpha^{i(b-1+k)} = \sum_{i=0}^{N-1} e_i \alpha^{i(b-1+k)} = \sum_{j=1}^{V+T} Y_j X_j^{b-1+k} \quad (6)$$

we set the constant b to b=0, and assume also d−1=32 parity symbols in the Reed-Solomon code. The syndromes, $$S_k = \sum_{n=0}^{255} r_n \alpha^{kn}, \text{ for } k = 0,1,2,\ldots 31 \qquad (29)$$

This allows a decimation-in-time, 25 6-point, FFT-like calculation using 8 stages. Each stage has 128 butterflies. Each butterfly needs one multiplication and two additions. Since only 32 output values are desired, in the last stage one needs only to compute the desired 32 syndromes from the 64 output values at the 7-th stage. This requires only 32 additions and 32 multiplications. At the 7-th stage, only 64 values are desired. Thus the desired 64 values in the 7-th stage are computed from the 128 output values of the 6-th stage. This requires 64 multiplications and 64 additions. Similarly, the desired 128 values in the 6-th stage are calculated from the 256 output values of the 5-th stage by 128 additions and 128 multiplications.

By eliminating computations of the unused points at each stage, the number of additions and multiplications can be reduced at least by 25% for computing 32 syndromes, compared with the same technique without the elimination.

At step 406 the power expansions of the known erasure locations for $X_j = \alpha^i$ evfor each known index i are computed, such that the i-th term r in the input sequence $r_n$ for n=0,1,2, ... (N−1) to the decoder is marked as an erasure. Then the polynomial expansion of the erasure locator, and the extended syndrome polynomial are computed by the recursive formula:

$$p_n(x) = p_{n-1}(x) \cdot (1 - X_n x) = p_{n-1}(x) - X_n \, x p_{n-1}(x) \bmod x^{d-1} \qquad (30)$$

for n=1,2, ... V where the $X_n$ are the known erasure locations detected at step 400. Here the initial condition of this recursion is $p_0(x) = S(x)$ for the extended syndrome polynomial and $p_0(x) = 1$ for the erasure-locator polynomial. At n=V one obtains $p_n(x)$ as the extended syndrome $S(x)v(x)$ for the initial condition $p^0(x)=S(x)$, and also the erasure locator $v(x)$ for the case $p_0(x)=1$. Another way to compute $S(x)v(x)$ is to compute the circular convolution of the coefficients of the two polynomials $S(x)$ and $v(x)$ by a FFT-like transform.

At step 408, the key equation $$S(x)\tau(x) = S(x)v(x)\lambda(x) = A(x) \bmod x^{d-1} \qquad (13)$$

is solved for the errata locator $A(x)$ and the errata evaluator $\lambda(x)$. The decoder typically uses a polynomial division to solve the key equation. The Euclidean algorithm is preferably used, so that the standard encoder and decoder can be implemented on the same chip.

At step 410 the errata-locator polynomial and the syndromes are used to obtain the entire transformed error pattern, using the equation $$E_n = -\sum_{k=1}^{V+T} \tau_k E_{n-k}. \qquad (18)$$

Step 412 applies the inverse transform to the transformed error sequence. Some novel ways of carrying out this step are described herein. A division by N is needed at the output of the inverse transform. This division is needed only for the non-zero terms.

Step 414 subtracts the error sequence from the corrupted data. This subtraction is needed only for the non-zero terms in the error sequence. There are at most d−1=N−K non-zero terms. This step can be combined with the non-zero detections in the division by N operation in the inverse transform.

The time domain decoder operates by using a root search shown in step 430 of FIG. 4b. The roots detected in step 430 can be carried out by a similar technique to that described above and referred to as "FFT-like". The root search of the error locator polynomial $$\lambda(x) = 1 + \sum_{j=1}^{T} \lambda_j x^j \qquad (31)$$

can be performed by a forward transform using the basic equations $$F_k = \sum_{n=0}^{N-1} f_n \omega^{nk} \qquad (32)$$

The forward transform is applied to the 256-point sequence 1 ,$\lambda_1, \lambda_2, \ldots \lambda_T, 0, 0, \ldots$) ... Then the forward transform computes $\lambda(a^i)$ for i=,1,2, ... 255, i.e. all of the non-zero elements in the field GF(257) This method has the advantage that only the forward transform is needed in the decoder.

The root searches can also be carried out by either a Chien search or Horner's formula for a root search of the error polynomial. In the software embodiment of the time domain decoder, the operative technique is chosen by determination of the value of T. If T is large, than the forward transform technique is the most efficient. The other techniques, are also possible.

Figure 8:
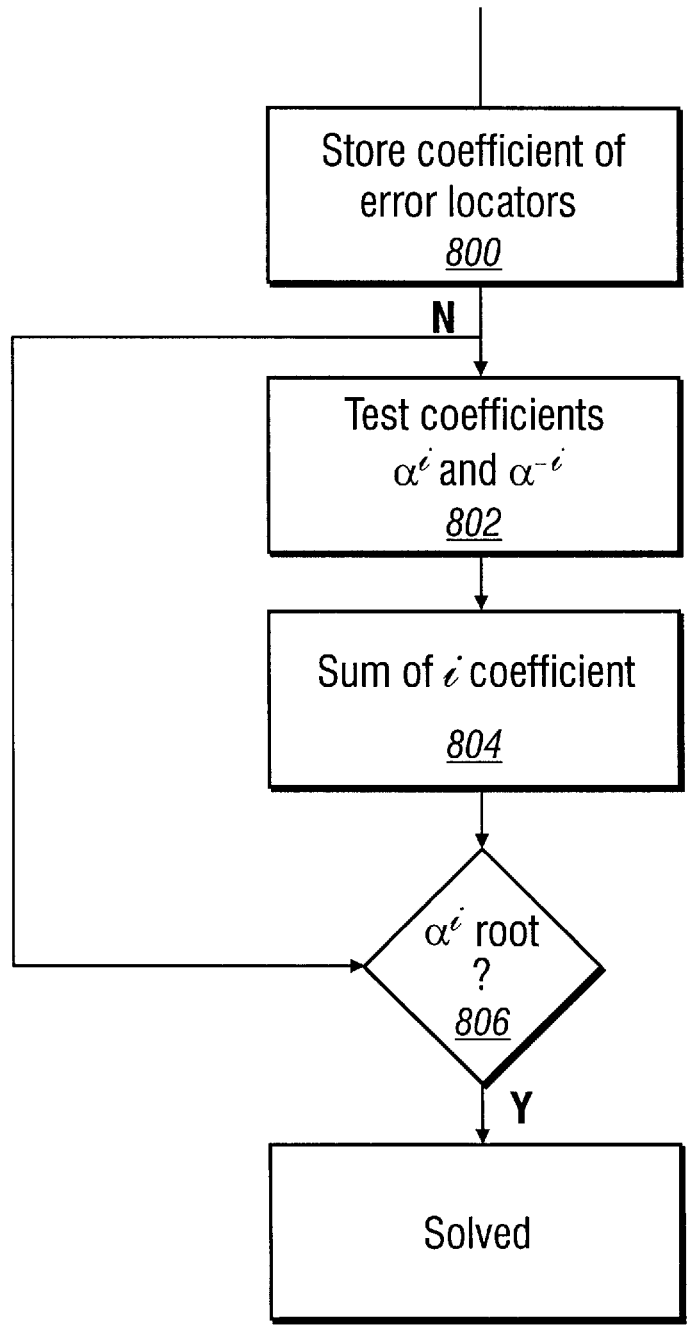
FIG. 8 shows a flowchart of solving for roots of equations.

The Chien search is carried out as shown in FIG. 8. First, at step 800, by first storing the coefficients of the error locators $\lambda(x)$ from equation (9):

$$v_{0,1} = \lambda_1, v_{0,2} = \lambda_2, \, v_{0,3} = \lambda_3, \ldots v_{0,T} = \lambda_T \text{ in } [d-\tfrac{1}{2}]$$

variables or registers $v_{0j}$ for j=1,2, ... [(d−1)/2], where [x] denotes the largest integer not exceeding x.

$$\lambda(\alpha^i) = 0 \text{ if and only if } \sum_{j=1}^{T} \lambda_j \alpha^{ij} = 1.$$

At step 802, coefficients are tested, using the test equation of $\alpha^{i+1}$ $$\sum_{j=0}^{T} \lambda_j \alpha^{(i+1)j} = \sum_{j=0}^{T} (\lambda_j \alpha^{ij}) \alpha^j + 1 = 0. \qquad (33)$$

Therefore, multiplication of the stored j-th coefficient $v_{i,j}$ by $\alpha^j$ at each test of $\alpha^i$ for i=0,1,2, ... Q−2, i.e., yields $$v_{i+1,j} = \alpha^{(i+1)j} = v_{i,j} \alpha^j \qquad (34)$$

for the root test of $\alpha^{i+1}$ in the j-th cell.

Then, at step 804 the coefficients $v_{i,j}$ for j=1,2, ... T are summed at step 806 to determine if $\alpha^i$ is a root at each test of $\alpha^i$.

The advantage of the Chien search is that each stored coefficient is multiplied by a constant in all of the tests. This property is useful in a 10 hardware implementation, since this avoids a full multiplier with two arbitrary inputs in each cell.

Notice that in GF(257) one has $\alpha^{i+128} = -\alpha^i$ and $$\lambda(\alpha^i) = \sum_{j=0,2,4,\ldots}^{T} \lambda_j \alpha^{ij} + \sum_{j=1,3,5,\ldots}^{T} \lambda_j \alpha^{ij} \qquad (35)$$

$$= \sum_{j=0,2,4,\ldots}^{T} v_{i,j} + \sum_{j=1,3,5,\ldots}^{T} v_{i,j},$$

-continued $$\lambda(-\alpha^i) = \sum_{j=0,2,4,\ldots}^{T} \lambda_j \alpha^{ij} - \sum_{j=1,3,5,\ldots}^{T} \lambda_j \alpha^{ij} \qquad (36)$$

$$= \sum_{j=0,2,4,\ldots}^{T} v_{i,j} - \sum_{j=1,3,5,\ldots}^{T} v_{i,j},$$

thus the computations can be reduced to one half by testing $\alpha^i$ and $-\alpha^i$ at the same time as shown in step 802, that is, by summing $v_{i,j}$ for all even j and odd j, separately. When all of the T roots of $\lambda(x)$ are obtained by step 806, then the technique stops before i=127.

Root Search by Horner's Formula

The root search can be performed also by Horner's formula. The advantage of Horner's formula is that at each test of $x=\alpha^i$ the computation only depends on $\lambda_j$ for j=1, 2, . . . T. Thus the root tests of all non-zero elements in the finite field GF(Q) can be performed simultaneously in a hardware implementation. Notice that this is impossible in the above Chien search since each test depends on a previous test. Also one can test two roots at the same time by applying Horner's formula to the following two polynomials $$\lambda^0(x) = \sum_{j=0,2,4,\ldots}^{T} \lambda_j x^j \qquad (37)$$

$$\lambda^1(x) = \sum_{j=1,3,5,\ldots}^{T} \lambda_j x^j \qquad (38)$$

Here $\lambda^0(x)$ and $\lambda^1(x)/x$ are evaluated as polynomials of $y=x^2$ by Horner's formula. Then one uses the identities $$\lambda(x)=\lambda^0(x)+\lambda^1(x) \text{ and } \lambda(-x)=\lambda^0(x)-\lambda^1(x)$$

to reduce the computation by one half. The implementation of Horner's formula is similar to a Chien search.

Both the modified Chien search and Horner's formula require about 128T multiplications and additions for the root search of $\lambda(x)$. In the worst case one needs to compute $128[(d-1)/2]$ multiplications and additions. For a large value of $[(d-1)/2]=16=T$, the FFT-like forward transform requires one half the number of multiplications and the same number of additions as the modified Horner's formula and the modified Chien search. However, the FFT-like technique is applicable only in GF(Q), where $Q=2^{2^m}+1$ is a Fermat prime for m=0,1,2,3,4. The Chien search and Horner's formula can be applied in any finite field.

Yet another root search technique, based on the difference expansion of a polynomial, is discussed herein. This difference expansion technique obtains dramatically fewer multiplications in a Reed-Solomon decoder than all of the other methods.

This root search is based on a definition of the difference operator of a polynomial to be $$\Delta f(x)=f(x+1)-f(X) \qquad (39)$$

and the (n+1)-th order difference operator to be $$\Delta^{n+1}f(x)=\Delta^n f(x+1)-\Delta^n f(x) \qquad (40)$$

for all positive integers n, and $\Delta^0 f(x)=f(x)$. Hence, by combining the above, we get $$\Delta^{n-1}f(x+1)=\Delta^{n-1}f(x)+\Delta^n f(x) \qquad (41)$$

for all positive integers n, and $\Delta^n f(x)=0$ for all integers n which are greater then the degree of the polynomial f(x). If $\Delta^n f(0)$ of a polynomial f(x) of degree M for n=0,1,2,3, . . . M are known, therefore, then f(j) can be evaluated by additions only for the positive integers j=0,1,2,3, . . . N−1. The formula $$\Delta^{n-1}f(j+1)=\Delta^{n-1}f(j)+\Delta^n f(j) \qquad (42)$$

is calculated repeatedly for n=1,2, . . . M−1. Notice that $\Delta^M f(j)=\Delta^M f(0)$ is constant for all integers j=0,1,2, . . . N−1. Therefore, one just updates $\Delta^M f(j+1)$ from $\Delta^M f(j)$, and f(j+1)=$\Delta^0 f(j+1)$ for n=0,1,2, . . . M−1 in each iteration of j=1,2, . . . N−1. The only thing remaining is how to compute $\Delta^n f(0)$ for a given polynomial f(x). The following theorem answers this question.

First we define the difference powers of x of order n by $$x^{(n)} = \prod_{i=0}^{n-1} (x-i) \qquad (43)$$

for all positive integers n and $x^{(0)}=1$. Any polynomial f(x) of degree M is expressed uniquely by $$f(x) = \sum_{n=0}^{M} a_n x^{(n)}, \qquad (44)$$

where $$\Delta^n f(0)=n! a_n \qquad (45)$$

for all integers n=0,1,2, . . . M. Proof: Notice that we can express f(x) as $$f(x)=(\ldots (a_M(x-(M-1))+a_{M-1})(x-(M-2))+a_{M-2})\ldots)x+a_0$$

Hence $a_n$ for n=0,1,2, . . . M can be computed by successive divisions of f(x) by x−n. The initial condition is $q_0(x)=f(x)$.

$$q_n(x)=q_{n-1}(x)(x-n)+a_n \text{ and } a_n=q_n(n)$$

is the remainder of each division. The uniqueness follows from the uniqueness of the remainders in the successive divisions. The $\Delta$ operator is linear. Also one has $\Delta x^{(m)}=m\Delta x^{(m-1)}$ for all positive integers m and that $\Delta C=0$ for a constant C. Next we can prove by mathematical induction that $\Delta^n x^{(m)}=(m!/(m-n)!)x^{(m-n)}$ for all integers $m \geq n$ and $\Delta^n x^{(m)}=0$ for the case m<n. Therefore, we have $$\Delta^n f(x) = \sum_{m=n}^{M} a_m(m!/(m-n)!)x^{(m-n)} \qquad (46)$$

and $$\Delta^n f(0)=n! a_n \qquad (45)$$

for all integers n=0,1,2, . . . M.

In the finite field GF(Q) for a prime Q, we can store the values n! mod Q for n=1,2, . . . M−1 to obtain $\Delta^n f(0)=n! a_n$ in GF(Q).

In the problem of a root search of the error locator in the Reed-Solomon decoder over GF(257), we set $f(x)=\lambda(x)$ and compute $\lambda(j)$ for j=0,1,2 , . . . 256 by the above method. To obtain $\Delta^n \lambda(0)$ for n=1,2, . . . T requires only T(T−1)/2 additions and T(T+1)/2 multiplications. $\lambda(j)$ requires at most T additions for each j=1,2 , . . . 256 to update $\Delta^n \lambda(j)$ for n=0,1,2. . . (T−1). Notice that this does not require updating $\Delta^n \lambda(j)$ for n+j>256. The technique terminates upon obtaining T roots of $\lambda(x)$. The total number of multiplications required in this new method is approximately T(T+1)/2 and the total number of additions is about 256T. The number of additions is the same as that of the original Horner's formula and the original Chien search and double that of the modified techniques. The number of multiplications is substantially less than any of the previous three methods.

In a software implementation of the proposed arithmetic operations over GF(257), if one multiplication is weighted as three or more additions, the proposed difference table approach is competitive in speed with the FFT-like forward transform for as many as d−1=32 parities and [(d−1)/2]=16 unknown error locations.

In a hardware implementation, the divisions required to obtain $\Delta^n\lambda(0)$ can be performed by the same division unit used for the Euclidean technique. Once $\Delta^n\lambda(0)$ for n=0,1,2, ...T are obtained, only additions are needed to locate all of the roots of $\lambda(x)$. This makes the difference-table approach very attractive in the chip implementation of an Reed-Solomon decoder, since no multipliers are needed in the root search part of the technique.

There is yet another way to carry out the root search according to the present invention. If the degree of the error locator $\lambda(x)$ (equation 9) is of degree less than 4. In that case, one can solve directly for the roots of the error locator. Effective techniques for solving quadratic and cubic equations over GF(257) are developed next.

1. Error locator of degree one: One needs to solve $\lambda_1 x + 1 = 0$ in GF(257) The only root is $-\lambda_1^{-1}$ for $\lambda_1 \neq 0$.

2. Error locator of degree two: The quadratic equation, $$x^2 + ax + b = 0 = (x + a/2)^2 + b - a^2/4,$$

can be solved in GF(257) if and only if there exists some $D \in GF(257)$ such that $D^2 = a^2/4 - b$. The two roots are $-a/2 \pm D$. In the power representation of the elements in GF(257) it is quite simple to determine D's existence.

3. Error locator of degree three: The cubic equation, $$x^3 + ax^2 + bx + c = 0,$$

can be transformed into $$y^3 + py + q = 0$$

by the substitution y=x−a/3, where $p=b-a^2/3$ and $q=c-ab/3+2(a/3)^3$. If q=0, then the cubic equation reduces to a quadratic equation. In the case $q \neq 0$ it is shown first that the cube root β of a given number q can be found in GF(257) such that $\beta^3 = q$ in GF(257) Therefore, the substitution $z = \beta_y$ yields $$z^3 + p'z + 1 = 0,$$

where $\beta^3 = q \neq 0$ and $p' = p/\beta^2$.

Since there are only 257 possible values of p', the cubic equations, $z^3 + p'z + 1 = 0$, for p'=0,1,2, ... 256 can be solved by one of many exhaustive root-search techniques in advance. These values are used to build a table such that for each p',z a corresponding root is stored. Since the error locator should have only non-zero simple roots, the transformed cubic equation from a valid error locator must have three simple roots and one of the roots fall in the interval [1,255]. Here only the roots of the cubic equation $Z^3 + p'z + 1 = 0$ for a valid p' in the range [1,255] need to be stored. The value 0 can be used to indicate that the transformed cubic equation for a particular p' is not valid.

Thus to solve an error locator of degree three one first transforms the cubic equation into the form $z^3 + p'z + 1 = 0$. Then one root of the transformed cubic equation is determine from the above described table. Hence one can reduce the cubic equation into a quadratic equation to solve for the other two roots. Therefore, a table of 8-bit numbers with 257 entries for all possible values of p'in GF(257) is sufficient for solving all possible cubic equations in GF(257)

In software or hardware implementations, the additional techniques needed to solve polynomials of degrees less than four can be used to speed up the root search dramatically when the number of unknown error locations is most likely less than four. As a consequence if most of the error locations in a corrupted codeword can be detected as erasures, then the decoder does not have to do an exhaustive root search very often and can decode most codewords very quickly. This makes the design and implementation of the erasure-detection part of such a high-speed communication system, which uses an Reed-Solomon code, most desirable.

Sometimes, despite all precautions, the input to the Reed-Solomon decoder has V erasures and T errors beyond the error correction capability of the decoder. If V+2T>d−1, then two situations can occur: decoding failure or decoding error. Decoding error means that a corrupted codeword is decoded into a codeword which differs from the original encoded codeword without any alarm. This happens only when a codeword is corrupted so badly that the eroded codeword falls within a correctable distance of a codeword which is different form the transmitted codeword. The probability of the decoding error depends on the weight distribution of the valid Reed-Solomon codewords. This probability is usually much smaller than the probability of a decoding failure.

In decoding failure, the Reed-Solomon decoder detects that the input data can not be corrected and issues a warning that the corrupted codeword is not recoverable. This is called a decoding failure. In this situation the input codeword usually remains intact.

In a transform-domain decoder, the decoding failure can be detected by checking if the recursive relation $$E_k = -\sum_{i=1}^{deg(\tau(x))} \tau_i E_{k-i} \qquad (47)$$

holds, where $\tau(x)$ is the errata locator and $E_k = E_{k \bmod N}$ is the transformed error sequence with $E_j = S_j$ for j=b, b+1, ... b+d−1. Notice that the above recursion starts with $E_j = S_j$ for j=b,b+1, ... b+d−1. Equation 47 is also checked for j=b,b+1, ... b+d−1 of the transformed error sequence. If not, then a decoding failure alarm is issued.

In a time-domain decoder the errata locator $\tau(x)$ should have simple non-zero roots only, and all of the error locations and erasure locations are different. Also the error magnitudes corresponding to the error locators should be non-zero. Finally, the degree of the errata evaluator polynomial A(x) should be no greater than V+deg($\lambda(x)$)−1. If any of the above conditions is violated, than a decoding failure alarm is issued. Notice that an erasure magnitude could be zero when an erasure location is marked incorrectly.

Decoding error means that a corrupted codeword is decoded into a codeword which differs from the original encoded codeword without any alarm. This happens only when a codeword is corrupted so badly that the eroded codeword falls within a correctable distance of a codeword which is different from the transmitted codeword. The probability of the decoding error depends on the weight distribution of the valid Reed-Solomon codewords. This probability is usually much smaller than the probability of a decoding failure.

The firmware embodiment of the present invention runs from source code written in "C" -language.

This section discusses implementation of the techniques needed to decode an Reed-Solomon code over GF(257) An informal "pseudo-code" type language is used to describe these techniques. Each description of a technique consists of a prologue which explains the purpose of the technique, the technique itself described by an informal language, and comments about the technique. The following rules are used in the description of an technique.

1. All statements are labeled with numbers. A statement may contain some labeled sub-statements, e.g. statement of loops and branches.
2. Any mathematical formulae and language descriptions are allowed in each statement.
3. A loop statement repeats until the specified stop condition is valid.
4. Capital letters are used to denote arrays for sequences. For example, A, for i =0,1,2, . . . N−1 is used for a sequence to be implemented as an array. A polynomial $$A(x) = \sum_{i=0}^{deg(A)} A_i x^i$$

is also stored as an array $A_i$ for i=0,1,2, . . . deg(A)
5. Temporary or scratch variables are named with a 'tmp' preface such as tmp1, and tmp2.
6. The equal sign=in a statement like a=a+1 means replacing the value stored in the variable a by the old value of a+1 as in most other programming languages.

The purpose of this informal language is to bridge the gap between the mathematical description and precise computer programming of a complex technique. The technique described can be transformed easily into any high-level computer language. However, the present description does not require the reader to be an expert in any particular programming language.

For these techniques the arithmetic operations of the variables are in the field GF(257) except for the loop-index variables. The symbol * is used for multiplication and + for additions. Some simple techniques are introduced first.

Technique 1 (Polynomial evaluation technique by Horner's formula)

This technique computes the $$sum = \sum_{i=0}^{N} A_i x^i,$$

where N=deg(A(x)) is the degree of the input polynomial.

```
1. sum = A_N
2. For (i = N − 1,N − 2, . . . 0)
    1. sum = sum * x + A_i
   End of loop i.
3. Return the value, sum = A(x).
```

The main computation is carried out in the statement, labelled as 2.1 sum =sum * x+$A_i$, in the loop statement 2.

A simplified one-line statement like For(i=N−1 , N−2, . . . 0)sum =sum * x+$A_i$ may be used in more complex techniques. This technique can be used for the direct syndrome computations, namely, $$S_j = \sum_{i=0}^{N-1} r_i x^i|_{x=\alpha j},$$

the error locator root search, and errata magnitude evaluations in an Reed-Solomon decoder.

Technique 2 (Polynomial Division Technique)

This technique computes the quotient and remainder polynomials for A(x)=B(x)Q(x)+R(x) and deg(R)≦deg(B) when given two input polynomials A(x) and B(x) in two arrays, and initially the quotient polynomial Q(x)=0. The remainder polynomial R(x) overwrites the array of A(x).

```
1. Begin the loop l.
    1. Check and update the degree of the
       current A(x).
    2. k = deg(A) − deg(B).
    3. If (k < 0), then exit loop l.
    4. Q_k = tmpQ = A_{deg(A)}/B_{deg(B)}
    5. A_{degA} = 0
    6. For (j = deg(B) − 1,deg(B) = 2, . . . 0).
        1. i = j + deg(A) − deg (B)
        2. A_i = A_i − tmpQ * B_j
       End of loop j
   End loop l.
```

Statement 1 is the main loop. The technique produces one term $Q_k X^k$ of the final quotient polynomial Q(x) at each iteration in loop 1. The computation is carried out in Statement 1.6.2 in the second loop 1.6.

This technique can be used for the standard Reed-Solomon encoder.

Technique 3 (Polynomial expansion for the extended syndrome polynomial)

This technique computes the extended syndrome polynomial $$T(x) = S(x) \prod_{j=0}^{v-1} (1 - A_j x) \bmod x^{d-1}.$$

The inputs are $S_i$ for i=0,1,2, . . . d−2 and $A_k$ for k=0,1,2, . . . v−1 in two arrays. The result T(x) overwrites the array of S(x).

```
1. For (i = 0,1,2, . . . v − 1)
    1. For (j = d − 2 . . . 1)
    2. S_j = S_j − A_i * S_{j-1}
   End of i.
```

The technique computes S(x) (1−$A_i$x)=S(x)−$A_i$·x·S(x) mod $x^{d-1}$ at each iteration of the main loop in Statement 1.

The extended syndrome is obtained from the syndrome polynomial S(x) and the erasure locations by this technique.

Technique 4 (Euclidean algorithm) This technique solve the key equation A(x)=T(x)λ(x) mod $x^{d-1}$ for a given T(x). Four arrays T, T2, U and U2 are used. The initial conditions are T for T(x), T2(x)=$x^{d-1}$, U(x)=1, and U2(x)=0. Also v erasures are known.

```
1. Set up array pointers:
   R0 = T2, R1 = T, P0 = U2, and P1 = U.
2. Begin main loop 2,
    1. Check and update deg(R0), deg(R1),
       deg(P0), and deg(P1).
    2. If (deg(R0) ≦ [(v + d − 3)/2]), then
       exit main loop 2.
    3. Begin loop 2.3.
        1. Qdeg = deg(R0) − deg(R1).
        2. IF (Qdeg < 0, then exit loop 2.3.
        3. tmpQ = R0_{deg(R0)}/R1_{deg(R1)}
        4. R0_{deg(R0)} = 0
        5. For (j = deg(R1) − 1,
           deg(R1) − 2, . . . 0)
            1. i = j + deg(R0) − deg(R1)
            2. R0_j = R0_j − tmpQ * R1_j
           End of loop j in 2.3.5.
        6. For (j = deg(P1) − 1,
           deg(P1) − 2, . . . 0)
```

-continued

```
    1. i = j + deg(P0) − deg(P1)
    2. P0_i = P0_i − tmpQ * P1_i
    End of loop in 2.3.6.
  End of loop 2.3.
  4. Swap R1 and R0.
  5. Swap P1 and P0.
  End main loop 2.
  3. If (P1_0 = 0), then issue an alarm of a
     decoding failure.
  4. For (i = deg(R1), deg(R1) − 1, . . . 0)
     R1_i = R1_i/P1_0
  5. For (i = deg(P1), deg(P1) − 1, . . . 0)
     P1_i = P1_i/P1_0
  6. Return the errata evaluator polynominal in
R1, and the error locator polynomial in P1.
```

This technique uses the technique of exchanges of pointers to perform the continual divisions in the Euclidean algorithm. Each iteration of the main loop in Statement 2 performs a polynomial division.

Technique 5 (Errata magnitude computations)

This technique computes the errata magnitudes, $$Y_k = A(X_k^{-1})/(X_k^{b-(v+t-1)} (\Pi_{j \neq k}(X_k - X_i)))$$

for k=0,1,2, . . . m−1, when given the errata evaluator A(x), all m=v+t errata locations $X_i$ for i=0,1,2, . . . m−1, and the parameter b.

```
1. For (k = 0,1,2, . . . m − 1)
   1. tmp = A(X_k^{-1})
   2. tmp = tmp/(X_k^{b−(m−1)})
   3. For (j = 0,1,2, . . . m − 1)
      1. If (j ≠ k),
         then tmp = tmp/(X_k − X_i).
   End of loop j.
End of loop k.
```

This technique uses errata locations instead of the errata locator polynomial to compute the errata magnitudes. The polynomial evaluations in Statement 1.1 can be computed by Technique 1.

Notice that all of the techniques described so far do not employ any specific property of the finite field GF(257) A main control program and the above techniques are enough to implement both the encoder and the decoder of the Reed-Solomon code over an arbitrary finite field GF(Q), provided that the basic arithmetic operations in the finite field GF(Q) can be realized.

The technique described next use properties of the field GF(257) in order to compute the syndromes and the roots of the error-locator polynomial for the Reed-Solomon code over GF(257)

Technique 6 (FFT technique)

This technique computes N=256 point forward transform $$B_k = \sum_{j=0}^{N-1} A_j w^{jk},$$

where $w^N=1$. The input is a sequence in an array $A_k$ for k=0,1,2, . . . N−1. The transformed sequence $B_k$ overwrites $A_k$ for k=0,1,2, . . . N−1. Two auxiliary arrays $BITREV_k$ and $W_k$ for k=0,1,2, . . . N−1 are used.

```
0. Initialize W_k, and BITREV_k for
   k = 0,1,2, . . . N − 1.
   1. W_0 = 1, W_1 = α
   2. For (k = 2,3, . . . N − 1) W_k = W_{k−1} * W_1
   3. BITREV_0 = 0
   4. For (m = 1,2,4,8,16 . . . N/2)
      1. For (j = 0,1,2, . . . m − 1)
         1. BITREV_j = 2 * BITREV_j
         2. BITREV_{j+m} = BITREV_j + 1
      End of loop j.
   End of loop m.
1. For (i = 0,1,2, . . . N − 1)
   1. k = BBITREV_i
   2. If (i < k), then swap A_i and A_k
   End of loop i in 1.
2. Set up stage index variables,
   jpnt = N/2, jbk = 2, and ioff = 1
3. For (stage = 1,2 . . . 8)
   1. For i = 0 to N − 1 step jbk
      1. jw = 0
      2. For (k = i, i + 1, . . . i +
         ioff − 1)
         1. k2 = k + ioff
         2. If (A_{k2} ≠ 0), then
            1. tmp = A_{k2} * W_{jw}
            2. A_{k2} = A_k − tmp
            3. A_k = A_k + tmp
            else
            4. A_{k2} = A_k
            End of 3.1.2.2.
         3. jw = jw + jpnt mod N
      End of loop k.
   End of loop i.
   2. Update stage index variables,
      jpnt = jpnt/2, ioff = jbk, and jbk = 2 * jbk.
   End of loop stage.
```

Statement 0 needs to be initialized only once. Bit reversal of the input array is performed in Statement 1. The 8 stage FFT is carried out in the loop in Statement 3. The butterfly computation is in Statement 3.1.2.2. The inverse transform can be obtained by setting $W_1=\alpha^{-1}$ in Statement 0.1 and appending the Statement For (i=0,1, . . . N−1)$A_i=A_i/N=-A_i$ at the end of the above technique. Since N=256=−1 in GF(257), a division by 256 is equivalent to the negative operation in GF(257) A slightly improved version can be obtained by treating the butterfly computations in stage 1 separately from the loop in Statement 3. The reason for this is that jw is always 0 in stage 1. Thus no multiplications are really needed in stage 1.

Notice that the above FFT technique is quite suitable for the root search of the error locator. The Statement 3.1.2.2 checks if $A_{k2} \neq 0$ before doing the butterfly computation. The error locator has at most $[(d+1)/2]$ non-zero terms at Stage 1. Also the number of non-zero terms is at most doubled at the output of each stage. Part of the butterfly computations are saved in the early stages when the number of non-zero terms in the sequence is small. Also checks for non-zero multipliers are required in the proposed table-look-up approach for multiplications in GF(257).

For the syndrome computation, actually only d−1 terms of the output sequence are desired. One can take advantage of this fact. For example, assume that only the first d−1=32 terms of the output sequence are the desired syndromes. The following modified technique can be used to save more than 25% of the computations.

Technique 7 (Modified FFT technique for 32 syndromes)

Assume that the same notations are used as in the previous FFT technique. Replace Statement 2 and Statement 3 in the original technique by the following statements:

```
          2. For (k = 0,2,4, . . . N – 2)
              1. K2 = k + 1
              2. tmp = A_{k2}
              3. A_{k2} = A_k – tmp
              4. A_k = A_k + tmp
              End of loop k.
          3. Set up stage index varibles:
jpnt = N/4, jpk = 4, and ioff = 2.
          4. For (stage = 2,3, . . . 8)
              1. For i = 0 to N – 1 step jbk
                  1. jw = 0
                  2. If (ioff < 32), then
                      1. For (k = i, i + 1, . . . i +
                         ioff – 1)
                          1. k2 = k + ioff
                          2. If (A_{k2} ≠ 0), then
                              1. tmp = A_{k2} * W_{jw}
                              2. A_{k2} = A_k – tmp
                              3. A_k = A_k + tmp
                              else
                              4. A_{k2} = A_k
                              End of 4.1.2.1.2.
                          3. jw = jw + jpnt mod N
                          End of loop k.
                      else
                      2. For (k = i, i + 1, . . . i +
                         31)
                          1. k2 = k + ioff
                          2. If (A_{k2} ≠ 0), then
                              A_k = A_k + A_{k2} * W_{jw}
                          3. jw = jw + jpnt mod N
                          End of loop k.
                      End of if in 4.1.2.
                  End of loop i.
              2. Update stage index variables:
jpnt = jpnt/2, ioff = jbk, and jbk = 2 * jbk.
              End of loop stage.
```

The first 32 terms $A_K$ for k=0,1,2, . . . 31) of the output sequence are the same as the original FFT technique.

Technique 8 (Root Search by a Difference Table)

This technique computes $$A(x) = \sum_{i=0}^{°(A)} A_i x^i$$

for x=1,2, . . . N by a difference table. The input array A(x) is overwritten. The results of $B_j = A(x=j)$ for j=1,2, . . . N are saved in the array B. An auxiliary array $FACTORIAL_n = n!$ is used.

```
        0. Initialize the array FACTORIAL_i for
i = 0,1,2, . . . d – 2.
            1. FACTORIAL_0 = 1
            2. For (i = 1,2, . . . d – 2) FACTORIAL_i =
               FACTORIAL_{i-1} * i.
            1. For i = 1,2, . . . deg(A) For (j = deg(A) –
               1, deg (A) – 2, . . . i) A_j = A_{j+1} * i + A_j.
            2. For (i = 2,3, . . . deg(A)) A_i = A_i *
               FACTORIAL_i .
            3. For j = 1,2, . . . N.
                1. For (i = 0,1,2, . . . deg(A) – 1)
                   A_i = A_i + A_{i+1}.
                2. Save A(x = j) in B_j = A_0.
                3. If B_j = 0, then a root of
                   A(x) = 0 at x = j is found.
                End of loop j.
```

Statement 0 initializes the array FACTORIAL. The successive divisions are performed in Statement 1. After Statement 2, one obtains $A_i = \Delta^i A(0)$ for i=0,1,2, . . . deg(A). Statement 3 calculates A(x=j) for j=1,2, . . . N and saves the results in $B_j = A(x=j)$.

Technique 9 (Main Control Module of the Reed-Solomon Decoder)

This is the main control module of the Reed-Solomon decoder. The array $A_i$ for i=0,1,2, . . . N–1 holds the received codeword, and $X_i = \alpha^j$ for i=0,1,2, . . . V–1 are the V erasure locations.

1. Compute the syndromes, $S_j = \sum_{i=0}^{N-1} A_i \alpha^{ji}$ by Technique 1, 6, or 7.

2. Compute the erasure locator, $$v(x) = \prod_{i=0}^{V-1} (1 - X_i x) \text{ by Technique 3.}$$

3. Use the Euclidean technique to solve the key equation for the errata evaluator and error locator by Technique 4.

4. Perform the root search for the error locator polynomial by Technique 1, 6, or 8.

5. Use the errata evaluator to evaluate the errata magnitudes by Technique 5.

6. Correct errors and erasures from the errata locations and magnitudes.

In the syndrome computation and the root search, if parallel processing is available then Technique 1 can be used, otherwise Technique 6 or 7 should be used for the syndrome computation and Technique 6 or 8 should be used for the root search problem.

This final embodiment uses an RS decoder over the Galois field GF(256) and is referred to herein as an RS(255, 223) decoder. This decoder operates as a time domain decoder.

As explained previously, the two major computational tasks in an RS decoder are the syndrome computations and the root search of the errata locator polynomial. This embodiment describes new techniques for the syndrome computations and the polynomial root search problem over the finite field GF(256). These new techniques are based on 15-point transforms and polynomial evaluations.

Syndrome Computations of the RS Decoder over GF(256)

Consider the RS (N=255,K=223) code with the generator polynomial g(x) of the form $$g(x) = \prod_{k=b}^{b+d-2} (x - \alpha^k), \quad (2)$$

where d–1=N–K=32 is the number of parity symbols and b is a constant integer to be chosen. b is set to 0 in order to simplify the syndrome computation.

The syndromes of the received code word, $r_i$, for i=0,1,2 . . . 254 are given by $$S_k = \sum_{i=0}^{254} r_i \alpha^{ik} \quad (6)$$

for k=0,1,2, . . . d–2=31. In the prior art, these equations were computed by a 255 point transform of the received data $r_i$ for i=0,1,2, . . . 254.

The inventors recognized, however, that only 32 output values of the 255-point transform are needed for the desired syndromes.

Figure 9:
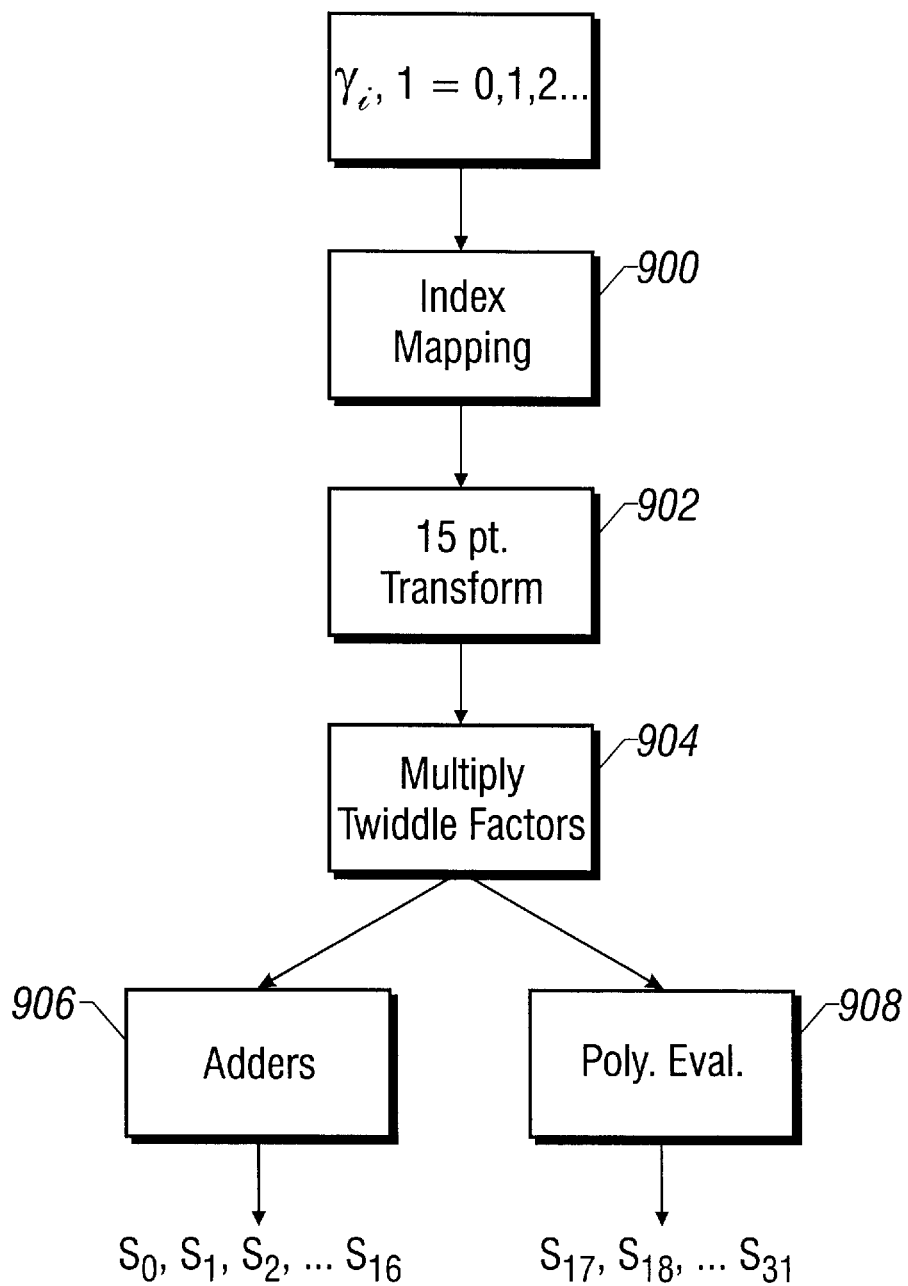
FIG. 9 shows a flowchart of how to solve for syndromes in a GF(255) using 15-point transforms.

The process operates according to the flowchart of FIG. 9. At step 900, the following two index-mappings i→($i_1$, $i_2$), and k→($k_1$, $k_2$), are formed, where i=17$i_1$+$i_2$ with $i_1$ and $i_2$ being the quotient and remainder of i divided by 17, for $i_1$=0,1,2, . . . 14 and $i_2$=0,1,2, . . . 16, and where $k=15k_1+k_2$, where $k_1$ and $k_2$ are the quotient and remainder of k divided by 15, for $k_1=0,1,2,\ldots 16$ and $k_2=0,1,2,\ldots 14$. These mappings allow the syndromes in equation (6) to be expressed as follows:

$$S_{k_1,k_2} = \sum_{i_1=0}^{14} \sum_{i_2=0}^{16} r_{i_1,i_2} \alpha^{255 i_1 k_1 + 17 i_1 k_2 + 15 i_2 k_1 + i_2 k_2} \quad (48)$$

$$= \sum_{i_2=0}^{16} \left[ \left( \sum_{i_1=0}^{14} r_{i_1,i_2} \alpha^{17 i_1 k_2} \right) \alpha^{i_2 k_2} \right] \alpha^{15 i_2 k_1}$$

$$= \sum_{i_2=0}^{16} B(i_2, k_2) \alpha^{15 i_2 k_1},$$

where $$B(i_2, k_2) = \left( \sum_{i_1=0}^{14} r_{i_1,i_2} \alpha^{17 i_1 k_2} \right) \alpha^{i_2 k_2} \quad (49)$$

for $k_2=0,1,2,\ldots 14$ and $i_2=0,1,2,\ldots 16$.

The computations of $B(i_2,k_2)$ require seventeen 15-point transforms shown at step 902, and point-wise multiplications for the "twiddle" factors $\alpha^{k_2 i_2}$ shown at step 904. By excluding multiplications by the twiddle factors of the unit 1, the number of multiplications required to multiply the twiddle factors is $16 \times 15 = 240$. This is very easy to accomplish, since the calculation of 15 point transforms can be simply done as described herein.

For the first 32 syndromes, one needs only to consider $k_1=0$, $k_1=1$ and $k_1=2$.

For the case $k_1=0$ we get $$S_k = S_{0,k_2} = \sum_{i_2=0}^{16} B(i_2, k_2) \quad (50)$$

for $k=k_2=0,1,2,\ldots 14$. For the other case $k=1$ we get $$S_k = S_{1,k_2} = \sum_{i_2=0}^{16} B(i_2, k_2) \alpha^{15 i_2} \quad (51)$$

for $k=15+k_2=15,16,\ldots 29$. For $k_1=2$, so that $k=30$ and 31, we have the following:

$$S_{30} = S_{2,0} = \sum_{i_2=0}^{16} B(i_2,0) \alpha^{30 i_2}$$

$$S_{31} = S_{2,1} = \sum_{i_2=0}^{16} B(i_2,1) \alpha^{30 i_2}$$

The inventors realized that this technique requires only $17 \times 16 = 272$ additions are needed to compute $S_k$ for $k=0,1,2,\ldots 14$ from (50). Also the computations of $S_{15+k_2}$ for $k_2=0,1,2\ldots 14$ can be computed by means of seventeen 16th-degree polynomial evaluations of (51), namely, $$\sum_{i_2=0}^{16} B(i_2, k_2) x^{i_2}|_{x=\alpha^{15}} \text{ and } \sum_{i_2=0}^{16} B(i_2, k_2) x^{i_2}|_{x=\alpha^{30}} \text{ for } S_{30} \text{ and } S_{31}. \quad (52)$$

Therefore, the entire calculation can be carried out using only an adding step 906 and a polynomial evaluation 908.

Figure 10:
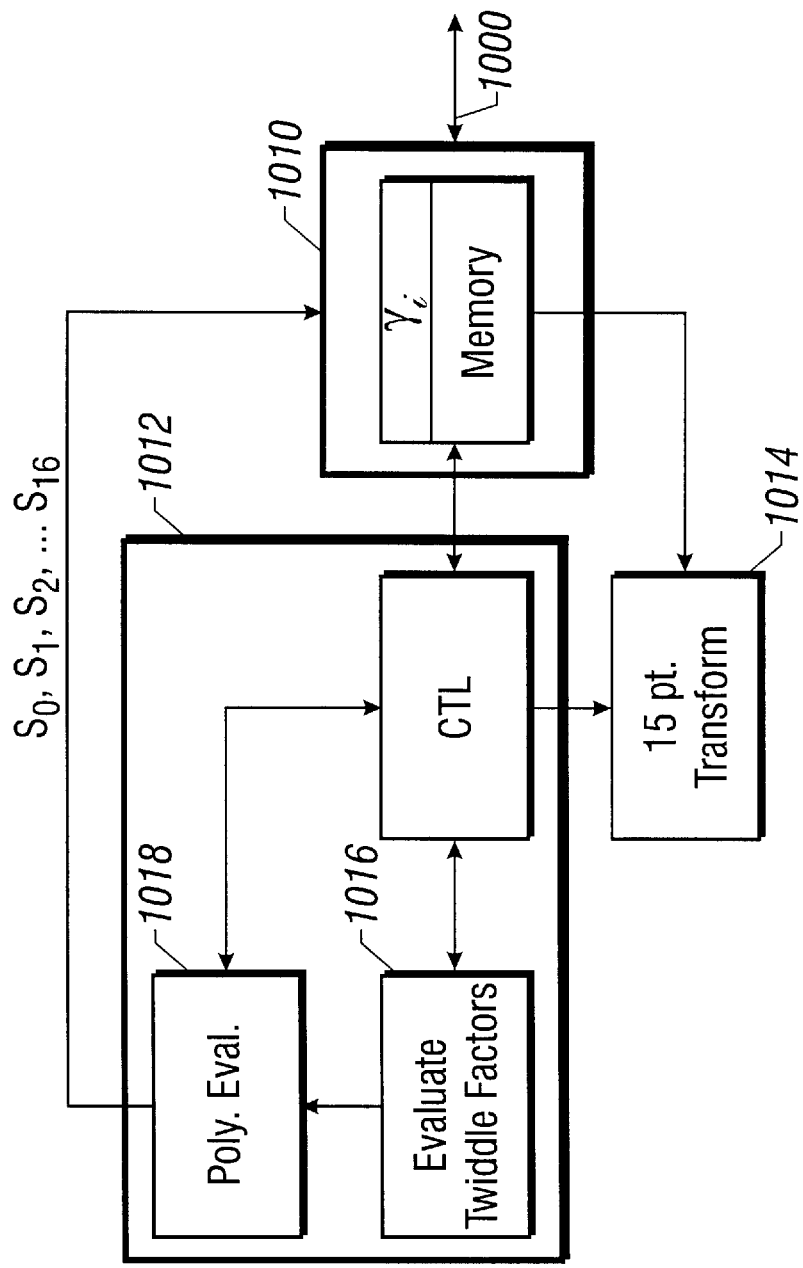
FIG. 10 shows the proposed VLSI hardware to carry out the syndrome calculation shown in FIG. 9.

One preferred hardware system for carrying out this embodiment is shown in FIG. 10. FIG. 10 shows a preferred VLSI calculation unit. The information to be evaluated is first received on line 1000, and stored in memory 1010. The memory can be, for example, a cash memory of a microprocessor. Controller 1012, which is preferably a risk-type microprocessor, controls the operation according to the flow chart of FIG. 9. Element 1014 is a 15-point transform unit, which is, for example, a VLSI implementation of the 15-point transform described with reference to step 902. Element 1016 and element 1018 are shown as being part of the microprocessor unit. Element 1016 evaluates the twiddle factors and element 1018 performs the polynomial evaluation. It should be understood, however, that the entire system could be implemented on one chip and by one microprocessor.

Next, the syndromes are related to the errata locations and errata magnitudes. If we define the following two sets: $v=\{X_i|X_i$ is an erasure location$\}$ and $\lambda=\{X_i|X_i$ is an error location$\}$, then the syndrome polynomial is defined by $$S(x) = \sum_{k=0}^{d-2} S_{b+k} x^k = \sum_{j=1}^{V+T} \frac{Y_j X_j^b}{1-X_j x} - \sum_{j=1}^{V+T} \frac{Y_j X_j^{b+d-1} x^{d-1}}{1-X_j x}, \quad (7)$$

where $X_j = \alpha^i$ for some integer i is the j-th errata location in the power of $\alpha$ and $Y_j$ is the j-th errata magnitude.

Defining again the following polynomials for the decoder:

The erasure locator:

$$v(x) = \Pi_{X_j \in v}(1 - X_j x) \quad (8)$$

The error locator:

$$\lambda(x) = \Pi_{X_j \in \lambda}(1 - X_j x) = 1 + \sum_{j=1}^{T} \lambda_j x^j \quad (9)$$

The errata locator:

$$\tau(x) = \prod_{j=1}^{V+T} (1 - X_j x) = v(x)\lambda(x) = 1 + \sum_{k=1}^{V+T} \tau_k x^k \quad (10)$$

The extended syndrome polynomial:

$$S(x)v(x) \quad (11)$$

The errata evaluator:

$$A(x) = \sum_{j=1}^{V+T} Y_j X_j^b \Pi_{i \neq j}(1 - X_i x) \quad (12)$$

The decoder has to solve the following key equation:

$$S(x)\tau(x) \equiv S(x)v(x)\lambda(x) \equiv A(x) \bmod x^{d-1} \quad (13)$$

for $\tau(x)$ and $A(x)$. The key equation can be solved by the Euclidean algorithm to determine $A(x)$ and $\tau(x)$ simultaneously from the following recursive pair of formulae:

$$\gamma_s(x) = -q_{s-1}(x)\gamma_{s-1}(x) + \gamma_{s-2}(x) \quad (14)$$

and $$R_s(x) = -q_{s-1}(x)\gamma_{s-1}(x) + R_{s-2}(x) \quad (15)$$

for $s=1,2,\ldots$, where the initial conditions are, respectively, $\gamma_0(x)=v(x), \gamma_{-1}(x)=0$, and $R_0(x)=S(x)v(x) \bmod x^{d-1}$, $R_{-1}(x) = x^{d-1}$. Here also $q_{s-1}(x)$ is the quotient polynomial of $R_{s-2}(x)$ divided by $R_{s-1}(x)$. The algorithm stops when the degree of $R_s(x)$ is less than or equal to $[(d-3+V)/2]$, where $[x]$ denotes the largest integer not exceeding a real number x, for the first time for some integer s" in the recursion process. Then one obtains the solutions, $A(x) = R_{s'}(x)/\gamma_{s'}(0)$ and $\tau(x) = \gamma_{s'(x)}/\gamma_{s'}(0)$ for (6) and (7) respectively.

In the time-domain decoder, the errata locations are found by locating the roots of $\tau(x)$ by an exhaustive search over the finite field. After an errata location is obtained, the corresponding errata magnitude is determined by $$Y_k = -A(X_k^{-1})/(X_k^{b-1} \tau'(X_k^{-1})) \quad (16)$$

for $k=1,2,\ldots V+T$.

Since the V erasure locations are known, the inventors realized that only the T unknown error locations need be searched. The inventors therefore devised the following modification of the original Euclidean technique. Instead of solving the errata locator, this embodiment solves the error locator $\tau(x)$ by changing the initial condition, $\gamma_s(x)$ in (6), in the Euclidean algorithm to $\gamma_0(x)=1$ and $\gamma_{-1}(x)=0$. By the same recursive formulae (6) and (7), one obtains the errata evaluator $A(x)=R_{s'}(x)/\gamma_{s'}(0)$ and the error locator $\tau(x)=\gamma_{s'(x)}/\gamma_{s'}(0)$ when the algorithm stops for the first time on the condition $\deg(R_{s'}(x)) \leq [(d+V-3)/2]$ for some integer s'. Then one searches the roots of $\tau(x)$ for unknown error locations. To obtain the errata magnitudes by this algorithm, the identity:

$$A(X_k^{-1}) = Y_k X_k^b \Pi_{j \neq k}(1 - X_j/X_K) \tag{53}$$

$$= Y_k X_k^{b-(V+T-1)}(\Pi_{j \neq k}(X_k - X_j)). \tag{54}$$

is solved to obtain $$Y_k = A(X_k^{-1})/(X_k^{b-(V+T-1)}(\Pi_{j \neq k}(X_k - X_j))) \tag{55}$$

for k=1,2, . . . V+T.

The computation of $$X_k^{b-(V+T-1)}(\Pi_{j \neq k}(X_k - X_j))$$

can be performed very efficiently. This new technique does not require the computation of the polynomial expansion of the erasure locator $v(x) = \Pi_{x_j}^{\epsilon V}(1-X_j)$. Also fewer arithmetic operations are needed in the polynomial multiplications in equation (6), since now the degree of the new $\gamma_s(x)$ is exactly V less than that of the old $\gamma_s(x)$ of the original algorithm. Actually the old and new $\gamma_s(x)$ in (6) differ by a polynomial factor, the erasure locator $v(x)$ of degree V.

Root Search by 15-point Transforms

Consider the root search problem of the error locator $$\lambda(x) = 1 + \sum_{i=1}^{T \leq 16} \lambda_i x^i. \tag{9}$$

Define L(k) such that $$L(k) = \lambda(\alpha^k) = \sum_{i=0}^{T} \lambda_i \alpha^{ik} \tag{56}$$

for k=0,1,2, . . . 254

Hence the root search can be performed by a 255-point transform of the sequence

Next, $\lambda_i$ for i=0,1,2, . . . 254 and $\lambda_i=0$ for $i \geq 17 > T$ and $\lambda_0=1$. The output values L(k) of the 255 point transform are just the error-locator polynomial evaluations, $L(k)=\lambda(x=\alpha^k)$ of all non-zero elements $\alpha^k$ for k=0,1,2, . . . 254 in GF(256). Notice that the degree of the error locator is at most 16 for an RS (255,223) code. Hence the input sequence $\lambda_i$ has at most 17 non-zero values.

Consider the following index-mappings, $i \rightarrow (i_1,i_2)$, and $k \rightarrow (k_1,k_2)$, where $i=15i_1+i_2$, $i_1$ and $i_2$ are the quotient and remainder of i divided by 15, for $i_1=0,1,2, \ldots 16$ and $i_2=0,1,2, \ldots 14$, and similarly $k=17k_1+k_2$, $k_1$ and $k^2$ are the quotient and remainder of k divided by 17, for $k_1 =0,1,2, \ldots 14$ and $k_2 =0,1,2, \ldots 16$. This allows us to rewrite equation (56) as follows:

$$L(k_1,k_2) = \sum_{i_1=0}^{16} \sum_{i_2=0}^{14} \lambda_{i_1,i_2} \alpha^{255 i_1 k_1 + 15 i_1 k_2 + 17 i_2 k_1 + i_2 k_2} \tag{57}$$

$$= \sum_{i_2=0}^{14} \left[ \left( \sum_{i_1=0}^{16} \lambda_{i_1,i_2} \alpha^{15 i_1 k_2} \right) \alpha^{i_2 k_2} \right] \alpha^{17 i_2 k_1} \tag{58}$$

$$= \sum_{i_2=0}^{14} M(i_2, k_2) \alpha^{17 i_2 k_1}, \tag{59}$$

where $$M(i_2, k_2) = \left( \sum_{i_1=0}^{16} \lambda_{i_1,i_2} \alpha^{15 i_1 k_2} \right) \alpha^{i_2 k_2}$$

for $k_2 =0,1,2, \ldots 16$ and $i_2=0,1,2, \ldots 14$. Since $\lambda_i=0$ for i >16, one has $\lambda_{i_1,i_2}=0$ for $i_1 \neq 0$ and $i_2>1$. Hence one obtains $$M(i_2,k_2)=\lambda_{0,i_2} \alpha^{i_2 k_2} \tag{60}$$

for $i_2=2,3,4, \ldots 14$ and $k_2 =0,1,2, \ldots 16$, and $$M(0,k_2)=\lambda_{0,0}+\lambda_{1,0}\alpha^{15 k_2}, \tag{61}$$

and $$M(1,k_2)=(\lambda_{0,1}+\lambda_{1,1}\alpha^{15 k_2})\alpha^{k_2}, \tag{62}$$

for $k_2 =0,1,2, \ldots 16$, respectively.

Figure 11:
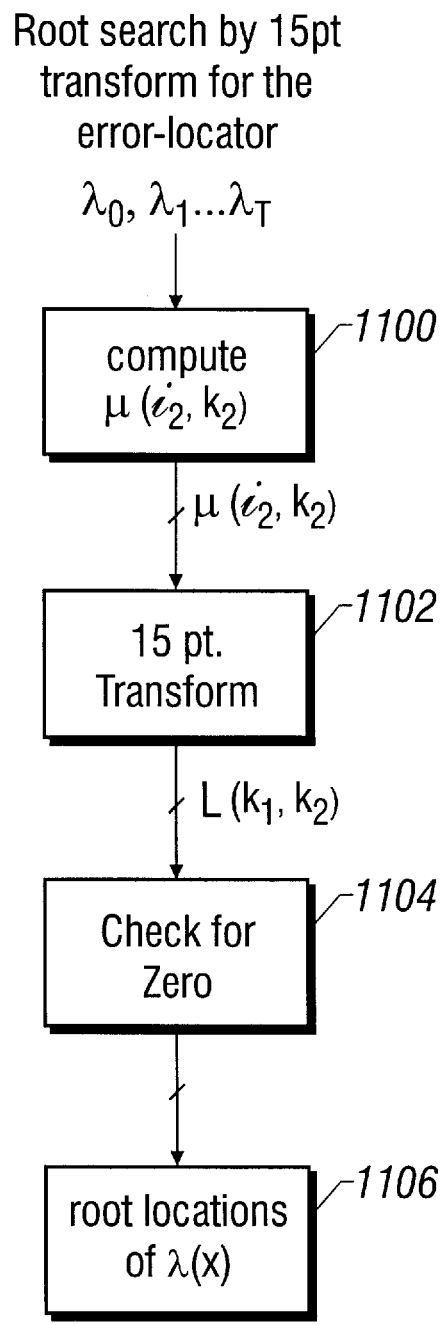
FIG. 11 shows a flowchart for a root search by 15-point transforms for the error locator.
Figure 12:
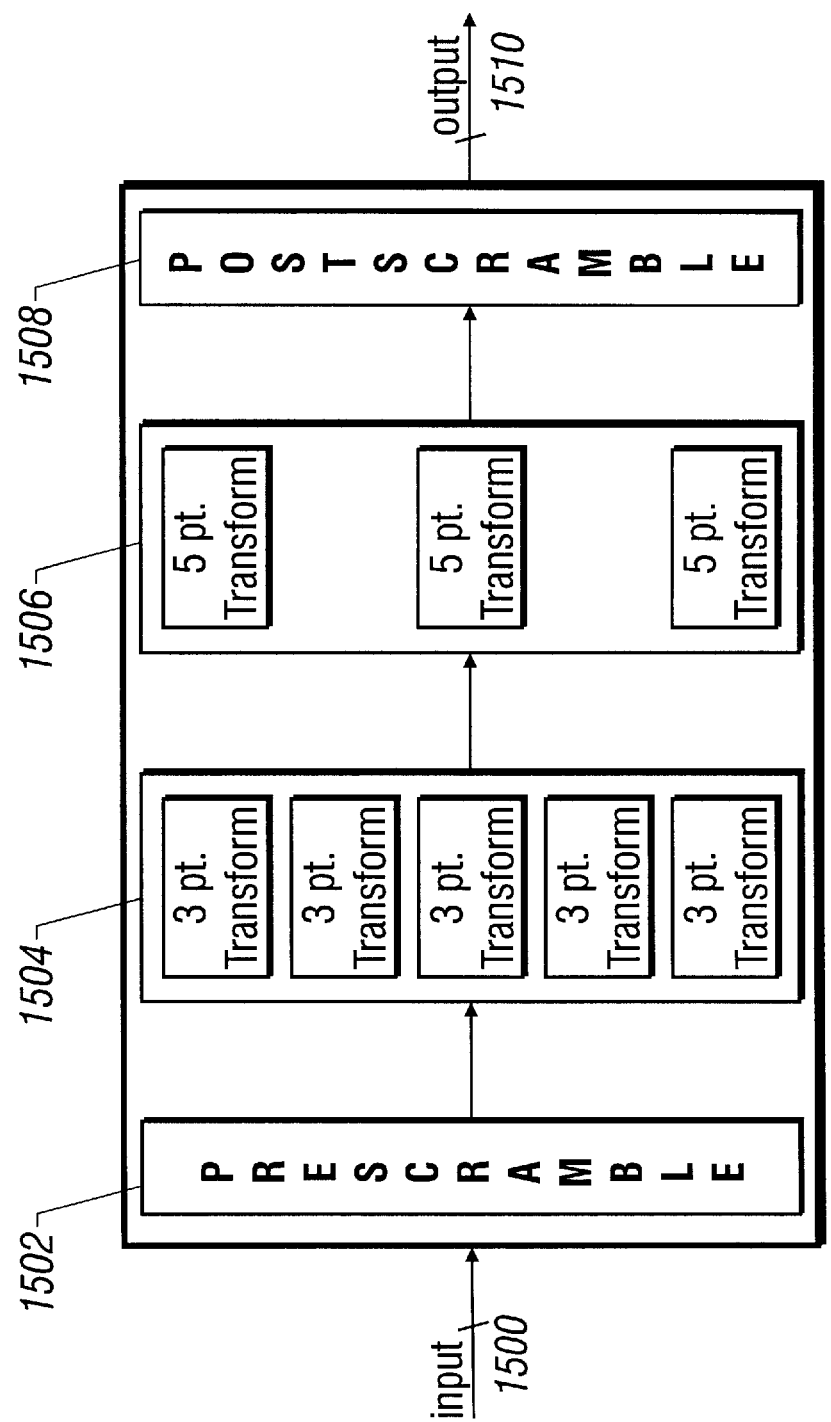
FIG. 12 shows the hardware, in block diagram form, for carrying out the transform.

The operation is shown in FIG. 11. At sep 1100 $M(i_2,K^2)$ is calculated from $\lambda_0 \ldots \lambda_T$. The computations of $M(i_2,k_2)$ require 13×16=208 multiplications for $M(i_2 >1,k_2)$, 16 multiplications and 17 additions for $M(0,k_2)$, and 32 multiplications and 17 additions for $M(1,k_2)$ for $k_2 =0,1,2, \ldots 16$, since multiplications by 1 can be excluded. If the degree of the error locator is less than 15, then $\lambda_{i_1,i_2}=0$ for $i_1 \neq 0$, and $M(i_2,k_2)=\lambda_{0,i_2}\alpha_i^{i_2 k_2}$ for $i_2=0,1,2, \ldots 14$ and $k_2 =0,1,2, \ldots 16$.

Therefore, the disclosed technique requires only pointwise multiplications to compute $M(i_2,k_2)$ for an error locator polynomial of degree less than 15.

At step 1102, Equation (58) is carried out to obtain $L(k_1,k_2)$ from $M(i_2,k_2)$ using seventeen 15-point transforms on $M(i_2,k_2)$ for $i_2 =0,1,2, \ldots 14$ for each integer $k_2 \in [0,16]$. At step 1104, the result is checked for zeros, and the output at line 1106 is the root locations of $\lambda(x)$.

As a consequence, only the required overhead for computing $M(i_2, k_2)$ and seventeen 15-point transforms are needed for the error-locator root search problem instead of the quite complex 255-point transform.

TABLE 1

Operation counts for computing 32 syndromes over GF(256
32 SYNDROMES

| OPERATION | DIRECT | 255-pt TRANSFORM | PROPOSED |
|---|---|---|---|
| Additions | 254 × 32 = 8128 | 4465 | 1772 |
| Multiplications | 254 × 31 = 8096 | 1135 | 852 |

TABLE 2

Operation counts for the root search of an
error-locator polynoinial of degree 16
ERROR-LOCATOR ROOT SEARCH

| OPERATION | DIRECT | 255-pt TRANSFORM | PROPOSED |
|---|---|---|---|
| Additions | 255 × 16 = 4080 | 4465 | 1326 |
| Multiplications | 255 × 16 = 4080 | 1135 | 596 |

The present embodiment discloses an efficient 15-point transform over GF(256). This efficient algorithm for computing a 15-point transform over GF(256) requires only 20 multiplications and 76 additions. The number of operations required for the syndrome computations and the error-locator polynomial root search in an RS (255,223) decoder by different methods are listed in Table 1 and Table 2.

These techniques are not limited to the codes listed herein, and can be generalized for other (N, K) RS or BCH codes, provided that N is composite and N–K is much smaller than N. For example, RS codes over $GF(2^{2m})$ with $N=2^{2m}-1 =(2^m-1)(2^m+1)$ can be treated in a similar manner.

The preferred hardware for carrying the 15-point transform is shown in FIG. 15. This follows the flowcharts given above. The input signal is input on line 1500, to a pre-scramble module which performs index re-mapping in a way which is known in the art and as described above. The index re-map signals are output to five parallel 3-point transform devices 1504. This allows the 5-point transforms to be performed in parallel. The output of 1504 is applied to 1506 which shows the 5-point transforms. Element 1508 is a postscramble device which index re-maps again to provide the output 1510.

Although only a few embodiments have been described in detail above, those having ordinary skill in the art will certainly understand that many modifications are possible in the preferred embodiment without departing from the teachings thereof.

All such modifications are intended to be encompassed within the following claims.

What is claimed is:

1. A half-duplex system using a single Reed-Solomon decoding device, comprising the steps of:
   means for determining if a communication is to be decoded or encoded;
   a single Reed-Solomon decoder, for both said encoding and said decoding;
   a parity marking device, receiving a message to be encoded and forming an extended and corrupted codeword in which all parity symbols thereof have been marked as erasures;
   a signal switching device responsive to said determining means, switching paths to couple a signal which is determined as one to be encoded to said parity marking device, and coupling said codeword including erasure-marked parity symbols to said single Reed-Solomon decoder, and to couple a signal to be decoded, directly, without making parities as erasures to said Reed-Solomon decoder, wherein said parity marking device includes:
      means for obtaining a message polynomial m(x) to be encoded, and
      means for forming the message polynomial m(x) into a codeword of the form m(x) xd−1+P(x)c, where P(x)c represents a deliberately-corrupted and marked parity portion, and
      means for feeding said deliberately-corrupted and marked message to said signal switching device.

2. A Reed-Solomon coding and/or decoding system comprising
   means for receiving an input sequence to be coded;
   means for calculating values necessary to translate the input sequence into an output sequence, and providing the output sequence based on said values,
   said calculating means including:
      two look-up tables, a NUM2POWER table having an input value of $\alpha^n$ and an output value of n, and a POWER2NUM table having an input value of k, and an output value of $\alpha^k$, where $\alpha$ is the primitive element of the calculation step; and
      means for carrying out a multiplication operation c=a×b mod Q by looking up: POWER2NUM [(NUM2POWER[a]+NUM2POWER [b]) mod (Q−1)] in said two look-up tables, such that all calculations can be carried out without any multiplications or divisions.

3. A Reed-Solomon coding and/or decoding system comprising:
   means for receiving an input sequence;
   means for calculating values necessary to translate the input sequence into an output sequence, and providing the output sequence based on said values,
   said calculating means including:
      two look-up tables, a NUM2POWER table having an input value of $\alpha^n$ and an output value of n, and a POWER2NUM table having an input value of k, and an output value of $\alpha^k$, where $\alpha$ is the primitive element of the calculation step; and
      means for carrying out a division operation c=a/b mod Q by looking up POWER2NUM [(NUM2POWER [a]−NUM2POWER [b]) mod (Q−1)] such that all calculations can be carried out without any multiplications or divisions.

4. A system as in claim 2, wherein said calculating means is a reduced instruction set type microprocessor.

5. A system as in claim 3, wherein said calculating means is a reduced instruction set type microprocessor.

6. A method of operating a half-duplex system using a single Reed-Solomon decoding device, comprising the steps of:
   determining if a communication is to be decoded or encoded;
   providing a single Reed-Solomon decoder for both said encoding and said decoding;
   if said signal is determined as one to be encoded, forming an erasure-marked codeword in which all parity symbols thereof have been intentionally marked as erasures, and coupling said codeword including erasure-marked parity symbols to said Reed-Solomon decoder;
   if said signal is to be decoded, coupling said signal directly, without marking, to said Reed-Solomon decoder;
   wherein said corrupting and erasure-marking step includes the steps of:
      obtaining a message polynomial m(x) to be encoded;
      forming the message polynomial m(x) into a codeword of the form m(x) $x^{d-1}$+P(x)c, where P(x)c represents a deliberately-corrupted and erasure-marded parity portion, and
      feeding said deliberately-corrupted and erasure-marked message to said Reed-Solomon decoder system.

7. A method of Reed-Solomon coding and/or decoding an input sequence into an output sequence, comprising the steps of:

receiving the input sequence;

calculating values necessary to translate the input sequence into an output sequence; and providing the output sequence based on said values, wherein said calculating values step includes the steps of:
storing in advance two look-up tables, a NUM2POWER table having an input value of $\alpha^n$ and an output value of n, and a POWER2NUM table having an input value of k, and an output value of $\alpha^k$, where $\alpha$ is the primitive element of the calculating step; and carrying out a multiplication operation c=a×b mod Q by looking up: POWER2NUM [(NUM2POWER[a]+NUM2POWER [b]) mod (Q−1)] in said two look-up tables, such that all calculations can be carried out without any multiplications or divisions.

8. A method of Reed-Solomon coding and/or decoding an input sequence into an output sequence, comprising the steps of:

receiving the input sequence;

calculating values necessary to translate the input sequence into an output sequence; and providing the output sequence based on said values, wherein said calculating values step includes the steps of:
storing in advance two look-up tables, a NUM2POWER table having an input value of $\alpha^n$ and an output value of n, and a POWER2NUM table having an input value of k, and an output value of $\alpha^k$, where $\alpha$ is the primitive element of the calculating step; and carrying out a division operation c=a/b mod Q by looking up POWER2NUM [(NUM2POWER[a]−NUM2POWER [b]) mod (Q−1)] such that all calculations can be carried out without any multiplications or divisions.

9. A method as in claim 7 wherein said operation is carried out by a reduced-instruction-set type microprocessor.

10. A method as in claim 8 wherein said operation is carried out by a reduced-instruction-set type microprocessor.

11. A method of operating to create Reed-Solomon values, comprising the steps of:

obtaining a Reed-Solomon message to be decoded;

computing syndromes from the data by using a forward transform defined by $$F_k = \sum_{n=0}^{N-1} f_n \omega^{nk} \tag{27}$$

in the Galois field of a prime number;

calculating only d−1 coefficients of the desired syndromes, where d=the number of errata, according to the equation $$S_{b-1+k} = \sum_{i=0}^{N-1} r_i \alpha^{i(b-1+k)} = \sum_{i=0}^{N-1} e_i \alpha^{i(b-1+k)} = \sum_{j=1}^{V+T} Y_j X_j^{b-1+k} \tag{6}$$

calculating a decimation in time FFT-like calculation using multiple stages and creating Reed-Solomon values based thereon.

12. A method of using a Reed-Solomon decoder to encode a message, comprising the steps of:

providing a Reed-Solomon decoder;

forming an erasure-marked codeword, including a message portion and a parity portion, and including areas of said parity portion which are intentionally marked as erasures;

feeding said erasure-marked codeword to the Reed-Solomon decoder; and using said Reed-Solomon decoder to decode the erasure-marked codeword into a valid codeword, which includes an intact message portion and a valid parity portion, and which hence represents an encoded message;

wherein said step of forming a deliberately-corrupted and erasure-marked codeword includes the steps of:
obtaining a message polynomial m(x) to be encoded;
forming the message polynomial m(x) into a codeword of the form m(x) $x^{d-1}$+P(x)c, where P(x)c represents a codeword with a corrupted and erasure-marked parity portion, all portions of which are marked as erasures, and
feeding the message polynomial with the corrupted and erasure-marked parity portion to said Reed-Solomon decoder system.

* * * * *